United States Patent
Shimada et al.

(10) Patent No.: US 8,659,018 B2
(45) Date of Patent: Feb. 25, 2014

(54) SEMICONDUCTOR DEVICE AND INTEGRATED SEMICONDUCTOR DEVICE

(75) Inventors: Gaku Shimada, Kanagawa (JP); Masami Kuroda, Tokyo (JP)

(73) Assignee: Sony Corporation, Tokyo (JP)

( * ) Notice: Subject to any disclaimer, the term of this patent is extended or adjusted under 35 U.S.C. 154(b) by 205 days.

(21) Appl. No.: 13/064,978

(22) Filed: Apr. 29, 2011

(65) Prior Publication Data

US 2011/0297932 A1 Dec. 8, 2011

(30) Foreign Application Priority Data

Jun. 8, 2010 (JP) ................................ 2010-131346

(51) Int. Cl.
*H01L 23/58* (2006.01)
*G01R 31/3187* (2006.01)

(52) U.S. Cl.
USPC ... 257/48; 257/686; 257/E23.002; 324/750.3; 324/762.06; 324/750.15

(58) Field of Classification Search
CPC ................................ G11C 16/20; G11C 29/48
USPC ....... 257/48, 723, E23.002, 686; 324/762.01, 324/762.06, 750.3, 750.15
See application file for complete search history.

(56) References Cited

U.S. PATENT DOCUMENTS

| | | | |
|---|---|---|---|
| 7,200,021 B2 * | 4/2007 | Raghuram | 365/51 |
| 7,925,949 B2 * | 4/2011 | Jeddeloh | 714/733 |
| 2005/0001306 A1 * | 1/2005 | Matsuo et al. | 257/686 |
| 2009/0085599 A1 * | 4/2009 | Choi et al. | 324/765 |

FOREIGN PATENT DOCUMENTS

JP    2005-122823    5/2005

* cited by examiner

*Primary Examiner* — Kenneth Parker
*Assistant Examiner* — Jose R Diaz
(74) *Attorney, Agent, or Firm* — Rader, Fishman & Grauer PLLC

(57) ABSTRACT

The present disclosure provides a semiconductor device including: a semiconductor identifier holding portion configured to hold a semiconductor identifier for identifying a semiconductor device; and a control portion configured such that upon elapse of a predetermined time period following receipt of an externally input instruction to hold the semiconductor identifier, the control portion issues an instruction to the semiconductor device immediately downstream of the semiconductor device to hold a semiconductor identifier of the immediately downstream semiconductor device and that during the time period between the point in time at which the externally input instruction is received and the point in time at which the instruction is issued to the immediately downstream semiconductor device to hold the semiconductor identifier thereof, the control portion causes the semiconductor identifier holding portion to hold the externally input identifier.

9 Claims, 10 Drawing Sheets

SEMICONDUCTOR DEVICE AND INTEGRATED SEMICONDUCTOR DEVICE

BACKGROUND

The present disclosure relates to a semiconductor device and an integrated semiconductor device. More particularly, the disclosure relates to a semiconductor device and an integrated semiconductor device having a circuit structure for supporting tests at the time of manufacture.

The integrated semiconductor device such as a multilayer semiconductor device formed by stacking semiconductor chips in multiple layers has a plurality of chip selection terminals for individually controlling the semiconductor chips configured. In many cases, a suitable number of these chip selection terminals are provided to address the layered semiconductor chips. It may thus be necessary to increase the number of chip selection terminals in proportion to a growing number of semiconductor chips in layers.

Techniques have been known to determine which of the multiple chip selection terminals to use on the semiconductor device. On such technique involves providing each of the chips with a unique chip ID and using fuse trimming so as to control the chips individually (e.g., see Japanese Patent Laid-Open No. 2005-122823 (FIG. 3)).

SUMMARY

According to the above-cited technique, once a chip ID is assigned to a given semiconductor chip, the relation between the chip ID and the corresponding chip selection terminal remains unchanged. This can entail the following problem at the manufacturing stage: a multilayer semiconductor device under test has its layered chip semiconductor devices measured individually. In this case, the test device in use may need as many terminals as the number of chip selection terminals for chip selection. Given the fact that multilayer semiconductor devices are mass-produced, it may be necessary for each test device to test simultaneously as many multilayer semiconductor devices as possible. However, since the number of terminals on the test device is finite, if it is desired to increase the number of multilayer semiconductor devices to be tested simultaneously, then there is no choice but to reduce the number of those terminals on the test device which can be assigned to a single multilayer semiconductor device. This can give rise to the situation where it is difficult for the test device to assign its terminals to all chip selection terminals typically at the time of testing. However, if the number of terminals to be assigned to the chip selection terminals is limited, then all semiconductor chips constituting the multilayer semiconductor device may not be measured. For example, suppose that the test device has only one terminal to be assigned to chip selection terminals. Each of the chip selection terminals corresponds to each of the semiconductor chips in the multilayer semiconductor device. It follows that the test device can control only one semiconductor chip corresponding to the chip selection terminal connected to the assigned terminal. That is, only that one semiconductor chip can be tested in this case.

The present disclosure has been made in view of the above circumstances and provides arrangements for reducing the number of those terminals on the test device which are assigned to chip selection terminals on the assumption that all semiconductor chips making up the integrated semiconductor device are to be tested.

According to one embodiment of the present disclosure, there is provided a semiconductor device including: a semiconductor identifier holding portion configured to hold a semiconductor identifier for identifying a semiconductor device; and a control portion configured such that upon elapse of a predetermined time period following receipt of an externally input instruction to hold the semiconductor identifier, the control portion issues an instruction to the semiconductor device immediately downstream of this semiconductor device to hold a semiconductor identifier of the immediately downstream semiconductor device and that during the time period between the point in time at which the externally input instruction is received and the point in time at which the instruction is issued to the immediately downstream semiconductor device to hold the semiconductor identifier thereof, the control portion causes the semiconductor identifier holding portion to hold the externally input identifier. This structure provides the function of holding the semiconductor identifier in response to the externally input instruction to hold the semiconductor identifier while instructing the immediately downstream semiconductor device to hold the semiconductor identifier thereof.

Preferably, the semiconductor device may further include a signal selection portion configured such that when, of a plurality of semiconductor device selection signals-input in correspondence with the semiconductor identifiers for selectively controlling semiconductor devices, the semiconductor device selection signal corresponding to the semiconductor identifier held in the semiconductor device identifier holding portion is enabled, the signal selection portion may enable internal circuits of the semiconductor device corresponding to the semiconductor identifier being held. This structure provides the function of allowing the semiconductor device to operate assuming that the semiconductor identifier thereof is being held in the semiconductor identifier holding portion.

Preferably, upon elapse of a predetermined time period following stop of the externally input instruction to hold the semiconductor identifier, the control portion may stop the instruction issued to the immediately downstream semiconductor device to hold the semiconductor identifier thereof; and during the time period between the point in time at which the externally input instruction to hold the semiconductor identifier is stopped and the point in time at which the instruction issued to the immediately downstream semiconductor device to hold the semiconductor identifier thereof is stopped, the control portion may cause the semiconductor identifier holding portion to reset the semiconductor identifier being held. This structure provides the function of resetting the semiconductor identifier in response to a stop of the externally input instruction to hold the semiconductor identifier while instructing the immediately downstream semiconductor device to reset the semiconductor identifier thereof.

Preferably, upon input of a hold command instructing the semiconductor identifier to be held, the control portion may instruct the immediately downstream semiconductor device to hold the semiconductor identifier thereof upon elapse of a predetermined time period following input of the hold command; and during the time period between the point in time at which the hold command is input and the point in time at which the immediately downstream semiconductor device is instructed to hold the semiconductor identifier thereof, the control portion may cause the semiconductor identifier holding portion to hold the semiconductor identifier. This structure provides the function of holding the semiconductor identifier in response to the hold command while instructing the immediately downstream semiconductor device to hold the semiconductor identifier thereof.

Preferably, the semiconductor device of the present disclosure may further include a fixed semiconductor identifier holding portion configured to hold a fixed semiconductor identifier corresponding to the semiconductor device; and only if, of a plurality of semiconductor device selection signals input in correspondence with the semiconductor identifiers for selectively controlling semiconductor devices, the semiconductor device selection signal corresponding to the fixed semiconductor identifier is enabled, may the control portion instruct the immediately downstream semiconductor device to hold the semiconductor identifier thereof and cause the semiconductor identifier holding portion to hold the semiconductor identifier. This structure provides the function of causing one of serially connected semiconductor devices of which the semiconductor device selection signal is enabled corresponding to the semiconductor identifier matching the fixed semiconductor identifier, to operate in response to the hold command.

Preferably, upon input of a reset command instructing the semiconductor identifier to be reset, the control portion may instruct the semiconductor device immediately preceding this semiconductor device to reset the semiconductor identifier of the immediately preceding semiconductor device. This structure provides the function of instructing the immediately preceding semiconductor device to reset the semiconductor identifier thereof.

Preferably, given an instruction from the immediately downstream semiconductor device to reset the semiconductor identifier, the control portion may instruct the immediately preceding semiconductor device to reset the semiconductor identifier thereof. This structure provides the function of allowing the immediately downstream semiconductor device to instruct the current semiconductor device to reset the semiconductor identifier thereof.

Preferably, upon receipt of an instruction to reset the semiconductor identifier while the immediately downstream semiconductor device is being instructed to hold the semiconductor identifier thereof in response to the input of the hold command, the control portion may stop the instruction to the immediately downstream semiconductor device to hold the semiconductor identifier thereof upon elapse of a predetermined time period following receipt of the instruction to reset the semiconductor identifier; and during the time period between the point in time at which the instruction to reset the semiconductor identifier is received and the point in time at which the instruction to the immediately downstream semiconductor device to hold the semiconductor identifier thereof is stopped, the control portion may reset the semiconductor identifier being held in the semiconductor identifier holding portion. This structure provides the function of allowing the semiconductor device having operated in response to the hold command to operate in response to the reset command.

According to another embodiment of the present disclosure, there is provided an integrated semiconductor device including a plurality of semiconductor devices, each of the semiconductor devices including: a semiconductor identifier holding portion configured to hold a semiconductor identifier for identifying a semiconductor device; and a control portion configured such that upon elapse of a predetermined time period following receipt of an externally input instruction to hold the semiconductor identifier, the control portion issues an instruction to the semiconductor device immediately downstream of the semiconductor device to hold a semiconductor identifier of the immediately downstream semiconductor device and that during the time period between the point in time at which the externally input instruction is received and the point in time at which the instruction is issued to the immediately downstream semiconductor device to hold the semiconductor identifier thereof, the control portion causes the semiconductor identifier holding portion to hold the externally input identifiers issued parallelly to all of the plurality of semiconductor devices. This structure provides the function of allowing each of the semiconductor devices making up the integrated semiconductor device to hold the semiconductor identifier of the semiconductor device in question in accordance with the externally input instruction to hold the semiconductor identifier while instructing the immediately downstream semiconductor device to hold the semiconductor identifier thereof.

According to the present disclosure outlined above, a desired semiconductor identifier can be set to each of the semiconductor devices constituting the integrated semiconductor device in accordance with the semiconductor identifier designated by an externally input semiconductor identifier designation signal. This arrangement makes it possible for the test device to control each semiconductor device using a single semiconductor identifier. That in turn provides the effect of reducing the number of terminals to be assigned to the chip selection terminals on the test device on the assumption that all semiconductor devices making up each integrated semiconductor device are to be tested.

DETAILED DESCRIPTION OF THE PREFERRED EMBODIMENTS

Some preferred embodiments of the present disclosure will now be described below. The description will be given under the following headings:

1. First embodiment (a structure whereby each of the chips making up a multilayer semiconductor device may be tested using signals input from a single chip selection terminal; an example in which an external control signal for designating a chip identifier to be set is input from the test device); and 2. Second embodiment (a structure whereby each of the chips making up a multilayer semiconductor device may be tested using signals input from a single chip selection terminal; an example in which a command for setting a chip identifier is input from the test device).

1. First Embodiment

Typical Structure of the Integrated Semiconductor Device

Figure 1:
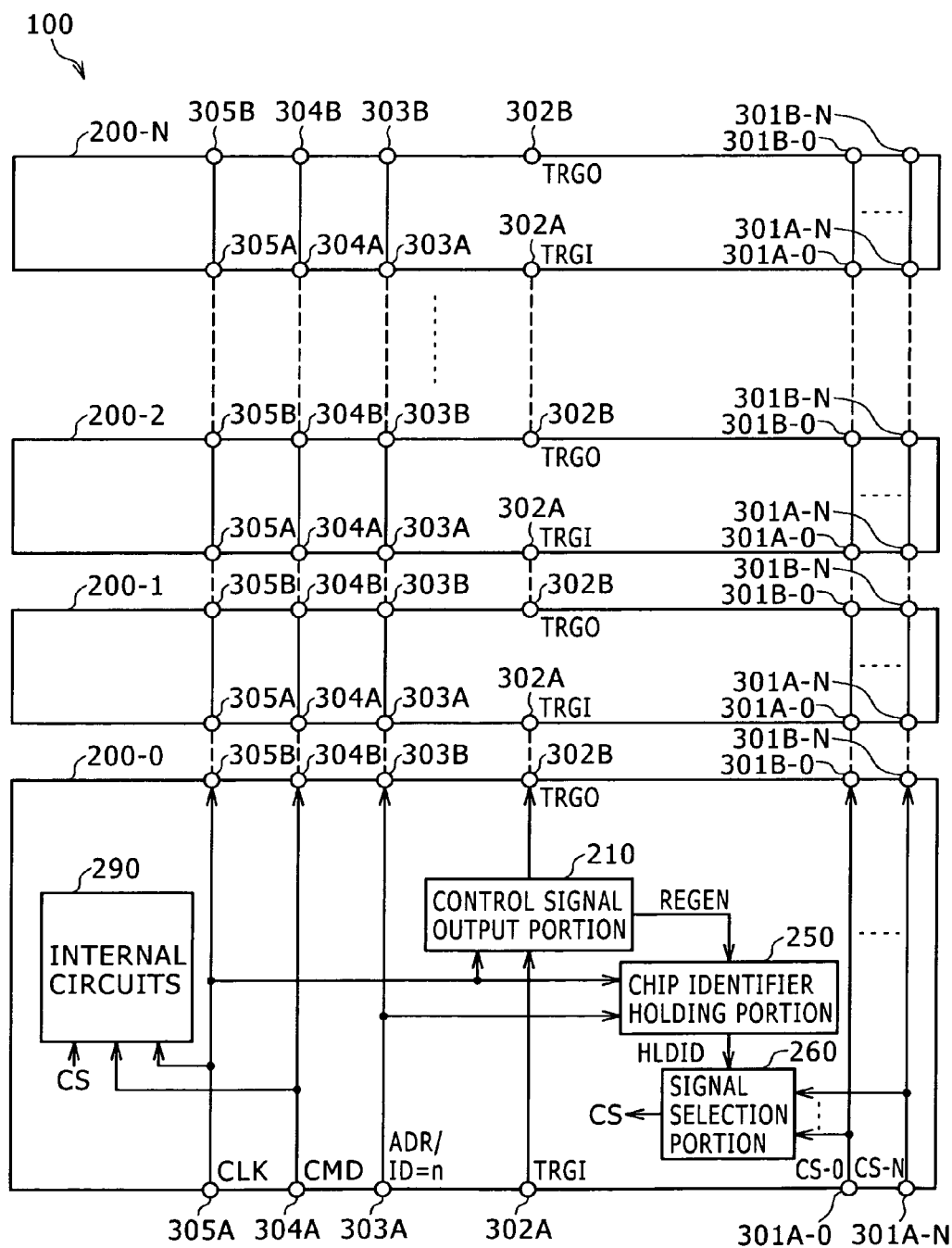
FIG. 1 is a schematic view showing a typical structure of an integrated semiconductor device as a first embodiment of the present disclosure.

FIG. 1 schematically shows a typical structure of an integrated semiconductor device 100 as the first embodiment of the present disclosure. The integrated semiconductor device 100 includes (N+1) chips ranging from a 0th chip 200-0 to an Nth chip 200-N. In FIG. 1, the 0th chip 200-0 through the Nth chip 200-N are shown connected in multiple layers. Each of the 0th chip 200-0 through the Nth chip 200-N is an individually independent semiconductor device. These chips have the same structure because they are manufactured through the same processes. In the first embodiment, each chip 200 may be assumed to be a DRAM (dynamic random access memory) in functionality but is not limited functionally thereto.

A typical structure of a single chip 200 is indicated by the schematic structure of the 0th chip 200-0 in FIG. 1. The chip 200 possesses the following terminals: (N+1) chip selection signal input terminals 301A-0 through 301A-N, and (N+1) chip selection signal output terminals 301B-0 through 301B-N. The chip selection signal input terminals 301A-0 through 301A-N are paired with the chip selection signal output terminals 301B-0 through 301B-N respectively, and they are interconnected internally. The chip selection signal output terminals 301B-0 through 301B-N of a single chip 200-$n$ are connected respectively to the chip selection signal input terminals 301A-0 through 301A-N of the immediately downstream chip 200-($n$+1).

Each chip 200 has a control signal input terminal 302A paired with a control signal output terminal 302B. The control signal output terminal 302B of a single chip 200-$n$ is connected to the control signal input terminal 302A of the immediately downstream chip 200-($n$+1).

Each chip 200 also has an address input terminal 303A paired with an address output terminal 303B. Inside the chip 200, the address input terminal 303A and address output terminal 303B are interconnected. The address output terminal 303B of a single chip 200-$n$ is connected to the address input terminal 303A of the immediately downstream chip 200-($n$+1). With this arrangement, an address signal ADR input to the 0th chip 200-0 at the first stage is supplied parallelly to the 0th chip 200-0 through the Nth chip 200-N.

Each chip 200 also has a command input terminal 304A paired with a command output terminal 304B. Inside the chip 200, the command input terminal 304A and command output terminal 304B are also interconnected. The command output terminal 304B of a single chip 200-$n$ is connected to the command input terminal 304A of the immediately downstream chip 200-($n$+1). With this arrangement, a command signal CMD input to the 0th chip 200-0 at the first stage is supplied parallelly to the 0th chip 200-0 through the Nth chip 200-N.

Each chip 200 also has a clock input terminal 305A paired with a clock output terminal 305B. Inside the chip 200, the clock input terminal 305A and clock output terminal 305B are also interconnected. The clock output terminal 305B of a single chip 200-$n$ is connected to the clock input terminal 305A of the immediately downstream chip 200-($n$+1). With this arrangement, a clock signal CLK input to the 0th chip 200-0 at the first stage is supplied parallelly to the 0th chip 200-$n$ through the Nth chip 200-N.

Furthermore, each chip 200 incorporates a control signal output portion 210, a chip identifier holding portion 250, a signal selection portion 260, and internal circuits 290. The control signal output portion 210 generates a downstream chip control signal TRGO upon input of an external control signal TRGI from the outside through the control signal input terminal 302A at test time, and outputs the generated signal TRGO through the control signal output terminal 302B. For example, the downstream chip control signal TRGO may be output in synchronism with the clock CLK. The downstream chip control signal TRGO is input to the immediately downstream chip 200 through its control signal input terminal 302A as the external control signal TRGI. The external control signal TRGI functions as a signal for designating the chip identifier to be set on the chip 200. The control signal output portion 210 also controls the timing at which the chip identifier holding portion 250 holds and then outputs the chip identifier using a chip identifier hold control signal REGEN and the above-mentioned downstream chip control signal TRGO for example. Incidentally, the control signal output portion 210 is an example of the control portion.

When the integrated semiconductor device is tested, the test device may typically input the address signal ADR to the address input terminal 303A. The chip identifier holding portion 250 holds the value of the chip identifier indicated by the input address signal ADR designating the value of the chip identifier to be set. The chip identifier holding portion 250 holds the chip identifier value and then outputs the value as a set chip identifier HLDID. Incidentally, the chip identifier holding portion 250 is an example of the semiconductor identifier holding portion.

The chip identifier input as the address ADR is any one of the chip identifiers assigned to the (N+1) chips ranging from the 0th chip 200-0 to the Nth chip 200-N. As a specific example, suppose that the chip identifiers (ID) to be assigned to the (N+1) chips made up of the 0th chip 200-0 through the Nth chip 200-N range from "0" to "N." In this case, one of the chip identifiers "0" through "N" is input as the address ADR. The operation timing at which to hold the chip identifier is set by the clock CLK and by the downstream chip control signal TRGO generated by the control signal output portion 210.

With this embodiment, the chip selection signal input terminals 301A-0 through 301A-N are provided corresponding to the chip identifiers "0" through "N," respectively. Chip selection signals CS-0 through CS-N are input to the chip selection signal input terminals 301A-0 through 301A-N, respectively. The signal selection portion 260 selects one of the chip selection signals CS-0 through CS-N input through the chip selection signal input terminals 301A-0 through 301A-N. The signal selection portion 260 inputs as a selection control signal the set chip identifier HLDID output by the chip identifier holding portion 250. That is, the signal selection portion 260 acts to select that chip selection signal CS-$n$ from the chip selection signal input terminal 301A which corresponds to the value of the chip identifier indicated by the set chip identifier HLDID.

The internal circuits 290 are an aggregate of the circuits that operate when the chip 200 is in normal operation. At test time, the internal circuits 290 are targeted to be tested. For example, if the chip 200 is a DRAM as mentioned above, the internal circuits 290 are composed of a memory array and its peripheral circuits. In this case, the memory array in the internal circuits 290 may be accessed in accordance with commands CMD such as a read or a write command input from the command input terminal 304A. The access operations are timed in accordance with the clock CLK. Also, while an enabled chip selection signal CS is being input from the signal selection portion 260, the internal circuits 290 enter an active state and become operable in response to the input command CMD. When the chip selection signal CS is not input, the internal circuits 290 are in an inactive state and reject the input of any command CMD for example. The signal selection portion 260 is an example of the signal selection portion.

Where the internal circuits 290 constitute a DRAM for example, suitable input/output terminals are provided in practice to handle a plurality of signals such as a clock enable signal, a row address strobe signal, a column address strobe signal, and a write enable signal. With this embodiment, for purpose of simplification and illustration, only the command input terminal 304A and command output terminal 304B were shown above to represent the signal terminals that may be actually configured. Although a plurality of input/output terminals are provided in practice to deal with addresses, only the address input terminal 303A and address output terminal 303B were shown above to represent the actual terminals that may be configured. Furthermore, the actual chip 200 possesses data input/output terminals which, however, are not shown.

[Typical Structure of the Integrated Semiconductor Device of the Multilayer Type]

Figure 2:
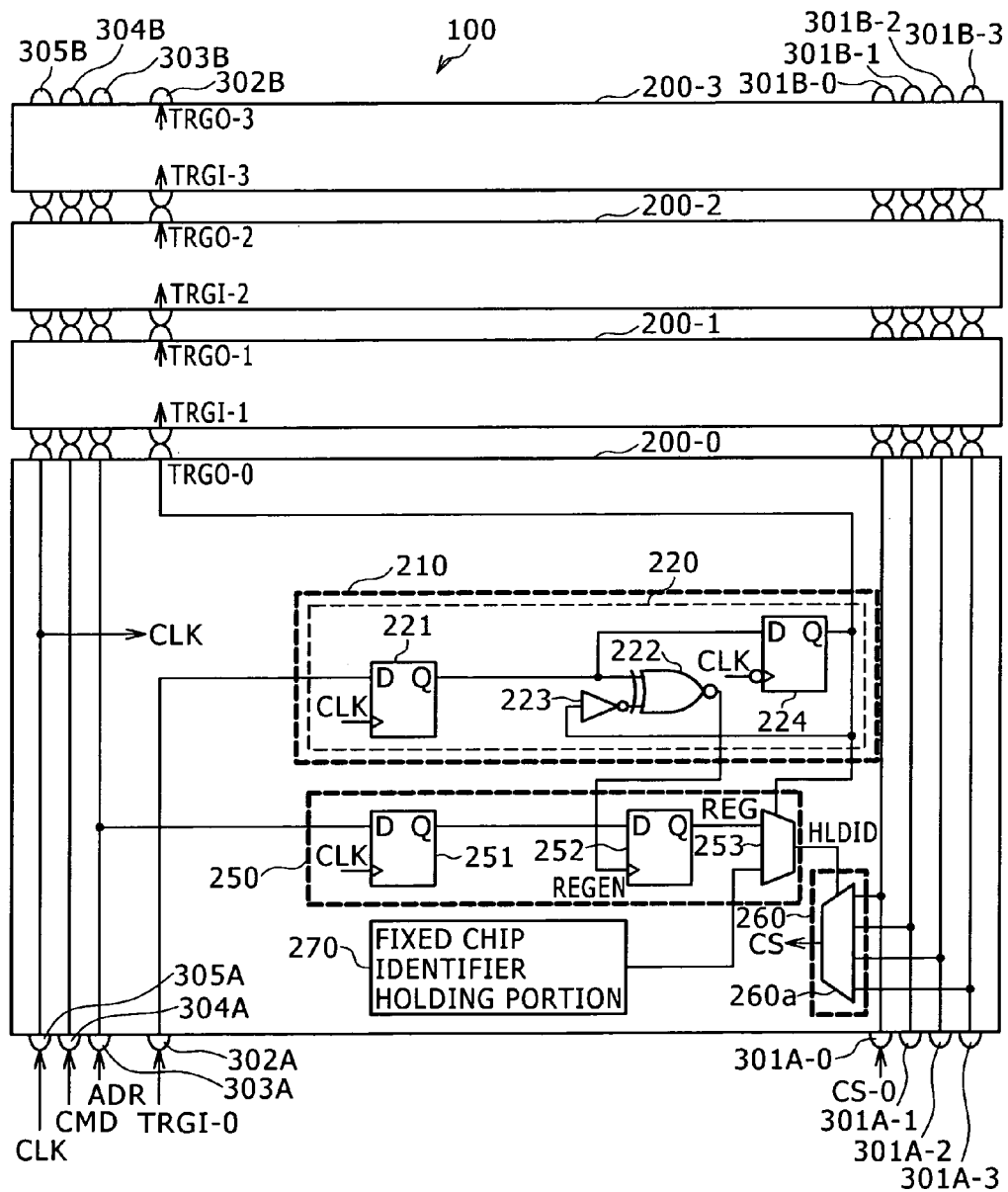
FIG. 2 is a schematic view showing a typical structure of the integrated semiconductor device of the multilayer type as the first embodiment.

The integrated semiconductor device as one embodiment of the present disclosure may be constituted in practice by chips 200 being stacked in multiple layers. FIG. 2 shows a typical structure of the integrated semiconductor device 100 of the multilayer type. In FIG. 2, the 0th chip 200-0 is shown having a concrete structure that includes the control signal output portion 210, chip identifier holding portion 250, and signal selection portion 260 already indicated in FIG. 1. FIG. 2 also shows a fixed chip identifier holding portion 270 for use in normal operation. For purpose of illustration, the integrated semiconductor device 100 in FIG. 2 is shown to have only four chips ranging from the 0th chip 200-0 to the third chip 200-3. The internal circuits 290 are not shown.

As illustrated in FIG. 2, the integrated semiconductor device 100 of the multilayer type has the 0th chip 200-0, the first chip 200-1, the second chip 200-2, and the third chip 200-3 stacked from the bottom up.

In this structure, each chip 200 has the chip selection signal input terminals 301A-0 through 301A-3, control signal input terminal 302A, address input terminal 303A, command input terminal 304A, and clock input terminal 305A furnished on the bottom side. Also, each chip 200 has the chip selection signal output terminals 301B-0 through 301B-3, control signal output terminal 302B, address output terminal 303B, command output terminal 304B, and clock output terminal 305B furnished on the top side. In practice, these terminals may be formed as micro-bumps for example.

On each chip 200 where a given terminal (micro-bump) furnished on the top side is paired with its counterpart on the bottom side, the paired terminals are located in the same position in the plane direction. With this arrangement, between two chips 200 that are vertically stacked adjacent to each other, the terminals furnished on the top side of the lower chip are connected by contact with their paired counterparts on the bottom side of the upper chip. That is, the chip selection signal output terminals 301B-0 through 301B-3 on the top side of the lower chip 200 are connected by contact with the chip selection signal input terminals 301A-0 through 301A-3 on the bottom side of the upper chip 200, respectively. The control signal output terminal 302B on the top side of the lower chip 200 is connected by contact with the control signal input terminal 302A on the bottom side of the upper chip 200. The address output terminal 303B on the top side of the lower chip 200 is connected by contact with the address input terminal 303A on the bottom side of the upper chip 200. The command output terminal 304B on the top side of the lower chip 200 is connected by contact with the command input terminal 304A on the bottom side of the upper chip 200. The clock output terminal 305B on the top side of the lower chip 200 is connected by contact with the clock input terminal 305A on the bottom side of the upper chip 200.

Inside the chip 200, the signal lines connecting the chip selection signal input terminals 301A-0 through 301A-N with the chip selection signal output terminals 301B-0 through 301B-N respectively are formed as through electrodes, also known as through-silicon vias (TSV). Likewise, the signal line connecting the address input terminal 303A with the address output terminal 303B inside the chip 200 is formed as a through electrode. Also, the signal line connecting the command input terminal 304A with the command output terminal 304B and the signal line connecting the clock input terminal 305A with the clock output terminal 305B are formed as through electrodes.

Explained below are typical structures of the control signal output portion 210, chip identifier holding portion 250, and signal selection portion 260 shown in FIG. 2. The control signal output portion 210 of the first embodiment contains only an external control signal support output portion 220 inside. The external control signal support output portion 220 includes a control signal input circuit 221, an exclusive-NOR gate 222, an inverter 223, and a control signal output circuit 224.

The control signal input circuit 221 inputs an external control signal TRGI from the control signal input terminal 302A and latches the input signal on the rising edge of the clock CLK for signal output. The exclusive-NOR gate 222 outputs the exclusive-NOR of the output from the control signal input circuit 221 and of the output from the inverter 223. The output of the exclusive-NOR gate 222 is input as the chip identifier hold control signal REGEN to the enable terminal of a chip identifier register 252 in the chip identifier holding portion 250.

The control signal output circuit 224 inputs the signal output by the control signal input circuit 221 and latches the input signal on the falling edge of the clock CLK for signal output. The output of the control signal output circuit 224 is output as the downstream chip control signal TRGO from the control signal output terminal 302B. The output of the control signal output circuit 224 is also input to the inverter 223. Furthermore, the output of the control signal output circuit 224 is input as a selector control signal to a selector 253 in the chip identifier holding portion 250.

The chip identifier holding portion 250 is made up of an address input circuit 251, the chip identifier register 252, and the selector 253. The address input circuit 251 inputs the signal which is fed from the address input terminal 303A as the address ADR and which designates the chip identifier to be set, and latches the input signal on the rising edge of the clock CLK for signal output.

In practice, the address signal ADR may be composed of a predetermined number of bits for example. Specifically, if there are four chips 200 configured as shown in the example of FIG. 2 so that there may be numerical chip identifiers "0" through "3," then a minimum of two bits may be needed. The circuits making up the chip identifier holding portion 250 are structured correspondingly to address the predetermined number of bits of at least two.

The chip identifier register 252 holds the value of the chip identifier output by the address input circuit 251 when the chip identifier hold control signal REGEN input to the enable terminal is High, which denotes the enabled state.

The selector 253 selects either a register value REG output by the chip identifier register 252 or the output from the fixed chip identifier holding portion 270 in accordance with the selection control signal output by the control signal output circuit 224, and outputs what is selected as the set chip identifier HLDID. When the selection control signal is High, the selector 253 selects the register value REG; when the selection control signal is Low, the selector 253 selects the value of a fixed identifier value output by the fixed chip identifier holding portion 270.

The fixed chip identifier holding portion 270 holds a chip identifier assigned fixedly beforehand to the chip in question (i.e., fixed chip identifier). For example, the fixed chip identifier may be used for chip selection in normal operation. It is assumed here that fixed chip identifiers are assigned to the 0th chip 200-0 through the third chip 200-3 as follows: a fixed chip identifier value of "0" is assigned to the 0th chip 200-0; and fixed chip identifier values of "1," "2" and "3" are assigned likewise to the first chip 200-1, second chip 200-2, and third chip 200-3 respectively. Incidentally, the fixed chip identifier holding portion 270 is an example of the fixed semiconductor identifier holding portion.

The signal selection portion 260 is composed of a single selector 260a as shown illustratively. For example, the selector 260a in FIG. 2 may possess four input terminals connected respectively to four signal lines that in turn are connected to the chip selection signal input terminals 301A-0 through 301A-3. When the set chip identifier HLDID input as the selection control signal is "0," the selector 260a selects the signal line connected to the chip selection signal input terminal 301A-0. Likewise, when the set chip identifier HLDID indicates one of the values "1" through "3," the selector 260a selects the corresponding one of the signal lines connected to the chip selection signal input terminals 301A-0 through 301A-3. The selector 260a proceeds to output the chip selection signal CS being output on the selected signal line to the internal circuits 290 (not shown in FIG. 2). The remaining first chip 200-1 through third chip 200-3 also have the same structure as that of the 0th chip 200-0 shown in FIG. 2.

[Typical Test Environment for the Integrated Semiconductor Device]

Figure 3:
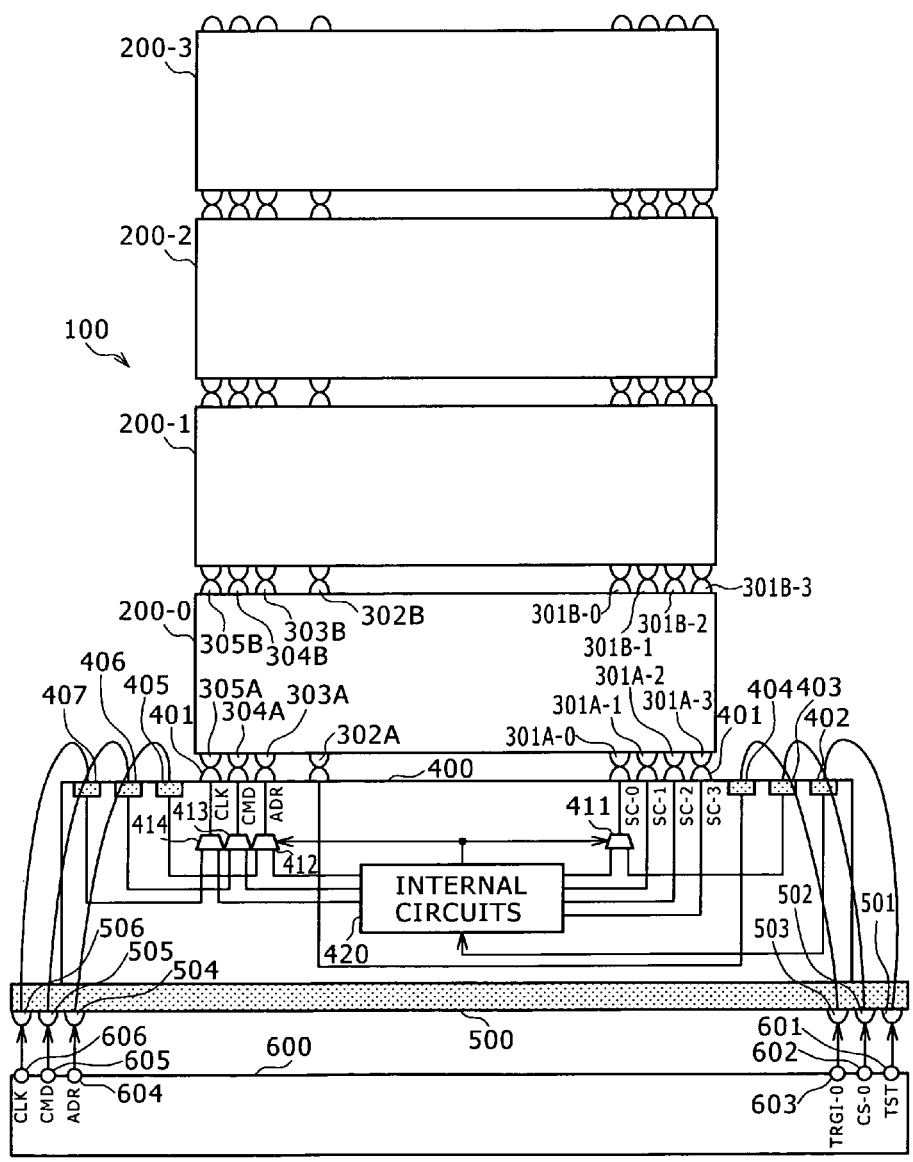
FIG. 3 is a schematic view showing a typical test environment for the integrated semiconductor device as the first embodiment.

FIG. 3 shows a typical test environment for the integrated semiconductor device 100 as the first embodiment of the present disclosure. In the example of FIG. 3, as in FIG. 2, the integrated semiconductor device 100 is shown structured with the four semiconductor chips (0th chip 200-0 through third chip 200-3) stacked in multiple layers. In the current context, the test means inspecting and measuring the integrated semiconductor device 100 for quality, performance, etc., at its manufacturing stage.

As shown in FIG. 3, the test environment for the integrated semiconductor device 100 is formed by first attaching a chip as a logic 400 in layered fashion to the bottom side of the 0th chip 200-0 at the lowest stage of the integrated semiconductor device 100. The logic 400 controls the chips 200 of the integrated semiconductor device 100 in normal operation, and is controlled by internal circuits 420. A package substrate 500 is attached to the bottom side of the logic 400. As a typical product, the semiconductor integrated device 100, logic 400, and package substrate 500 may be integrated in a single unit. On the bottom side of the package substrate 500, there are provided six terminals 501 through 506 corresponding to the signal lines led from a test device 600.

On the top side of the logic 400, there are provided a plurality of terminals 401 corresponding individually to the terminals disposed on the bottom side of the 0th chip 200-0. That is, the terminals 401 are provided to correspond individually to the chip selection signal input terminals 301A-0 through 301A-N. There are also provided terminals 401 corresponding individually to the control signal input terminal 302A, address input terminal 303A, command input terminal 304A, and clock input terminal 305A. On the top side of the logic 400 in the outer periphery of the terminals 401, there may be provided six pads 402 through 407 for example. These six pads are connected by wire bonding to the signal lines led from the terminals 501 through 506 on the package substrate 500.

The test device 600 is used to test the integrated semiconductor device 100. The test device 600 supporting the first embodiment of the present disclosure outputs a test control signal TST, a chip selection signal CS-0, an external control signal TRGI-0, an address ADR, a command CMD, and a clock CLK with regard to a single integrated semiconductor device 100. On the test device 600, terminals 601 through 606 are provided to output the test control signal TST, chip selection signal CS-0, external control signal TRGI-0, address ADR, command CMD and clock CLK, respectively. In practice, groups of these signals may be output through other terminals, not shown, to a plurality of integrated semiconductor devices 100.

The test control signal TST is input to the internal circuits 420 in the logic 400 via the pad 402 from the terminal 501. The chip selection signal CS-0 is input to one of the input terminals of a selector 411 in the logic 400 via the pad 403 from the terminal 502. The external control signal TRGI-0 is connected to the control signal input terminal 302A of the 0th chip 200-0 via the pad 404 from the terminal 503 and via, the terminal 401 on the top side of the logic 400. The address ADR is input to one of the input terminals of a selector 412 in the logic 400 via the pad 405 from the terminal 504. The command CMD is input to one of the input terminals of a selector 413 via the pad 406 from the terminal 505. The clock CLK is input to one of the input terminals of a selector 414 in the logic 400 via the pad 407 from the terminal 506.

In normal operation, the internal circuits 420 of the logic 400 output one of the chip selection signals CS-0 through CS-3 arbitrarily. In normal operation, the internal circuits 420 may output two or more of the chip selection signals CS-0 through CS-3 in order to have a plurality of chips selected. The chip selection signal CS-0 output by the internal circuits 420 is connected to the other input terminal of the selector 411. The output of the selector 411 is fed to the chip selection signal input terminal 301A-0 of the 0th chip 200-0 via the terminal 401 corresponding to the chip selection signal CS-0. Also, the chip selection signals CS-1 through CS-3 output by the internal circuits 420 are supplied to the chip selection signal input terminals 301A-0 through 301A-3 of the first chip 200-0, respectively, via the corresponding terminals 401.

In normal operation, the internal circuits 420 output various addresses ADR and commands CMD as needed. The internal circuits 420 also generate and output the clock CLK. Each of the address ADR, command CMD, and clock CLK output by the internal circuits 420 is input to the other input terminal of each of the selectors 412 through 414, respectively. The output of the selector 412 is fed to the address input terminal 303A of the 0th chip 200-0 via the corresponding terminal 401. The output of the selector 413 is sent to the address input terminal 304A of the 0th chip 200-0 via the corresponding terminal 401. The output of the selector 414 is supplied to the address input terminal 305A of the 0th chip 200-0 via the corresponding terminal 401.

If the test control signal TST typically goes High to indicate that test mode is in effect, the internal circuits 420 set the selectors 411 through 414 in a state that selectively outputs the signals input from the test device 600. The settings provide the state in which the chip selection signal CS-0, external control signal TRGI-0, address ADR, command CMD, and clock CLK from the test device are input unchanged to the 0th chip 200-0. That is, suitable signal paths are provided to support the test environment.

In normal operation, on the other hand, the test control signal TST is not input so that the signal TST may maintain Low, for example. In response, the internal circuits 420 sets the selectors 411 through 414 in a state that selectively outputs the signals output by the internal circuits 420. The settings make it possible for the internal circuits 420 to control the chip 200 corresponding to normal operation.

[Outline of the Workings of the Integrated Semiconductor Device in Test Mode]

The following constraint exists on the testing of the integrated semiconductor device 100 as one embodiment of the present disclosure: On each of the chips 200 shown in FIG. 2, there are provided four chip selection signal input terminals 301A-0 through 301A-3 corresponding to the four chips 200 being stacked in layers. However, the test device is allowed to use only one terminal for connection with the chip selection signal input terminal of one integrated semiconductor device 100. This constraint is in effect generally because of the need of one test device simultaneously to test as many integrated semiconductor devices 100 as possible.

Thus as shown in FIG. 3, the test device 600 has only one terminal 602 as the terminal through which to feed the chip selection signal to one integrated semiconductor device 100. In this setup, only the chip selection signal CS-0 is input from the test device 600 to each of the chips 200 constituting the integrated semiconductor device 100 via the signal path corresponding to the chip selection signal input terminal 301A-0. The chip selection signal CS-0 corresponds to the chip identifier having the value "0."

In this case, for example, if a fixed chip identifier to be stored in the fixed chip identifier holding portion 270 is used in the same manner as in normal operation, only the 0th chip 200-0 can select the chip selection signal CS-0 and feed it to the internal circuits 290. That is, the 0th chip 200-0 alone can be tested while the remaining first chip 200-1 through third chip 200-3 remain untested.

With this embodiment of the present disclosure, there are provided inside the chip 200 the control signal output portion 210 and chip identifier holding portion 250 discussed above in reference to FIG. 2. These portions make it possible to set a desired chip identifier to each of the configured chips 200, as will be explained below. For example, the chip identifier having the value "0" may be set to any one of the 0th chip 200-0 through the third chip 200-3; the remaining chips may each be assigned the chip identifier having a value other than "0." That is, despite the condition in which only the chip selection signal CS-0 is output from one chip selection signal input terminal 301A-0, it is possible to test the 0th chip 200-0 through the third chip 200-3.

[Example of the Chip Identifier Set Operation]

Figure 4:
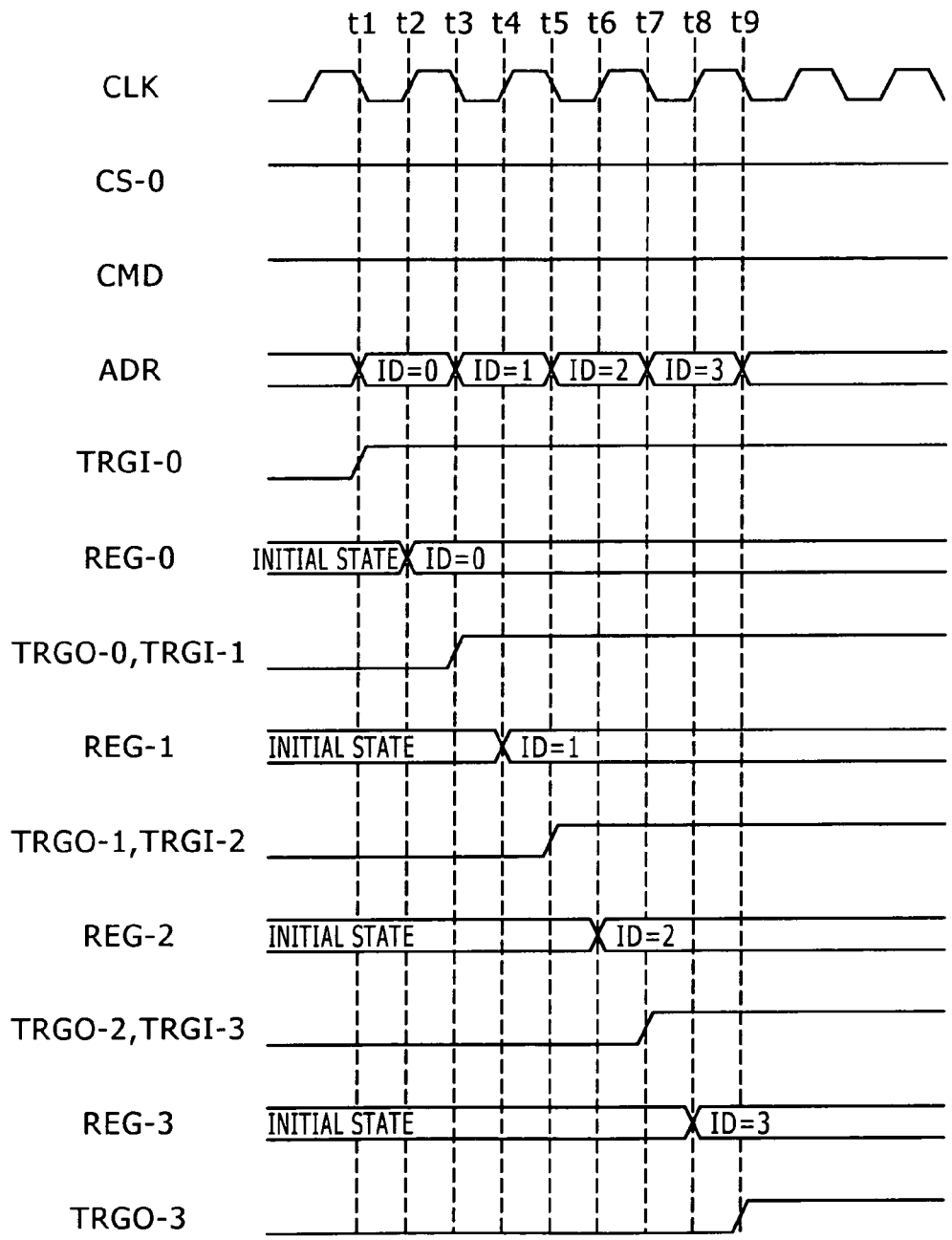
FIG. 4 is a timing chart showing typical operation timings corresponding to the chip identifiers being set of a 0th chip through a third chip in the first embodiment.

The timing chart in FIG. 4 shows an operation example corresponding to the setting of chip identifiers performed by the integrated semiconductor device 100 of which the structure is shown in FIG. 2, in the test environment indicated in FIG. 3.

Where a chip identifier is to be set with the first embodiment of the disclosure in use, the chip selection signal CS-0 and address ADR are set in a manner preventing effective signals from getting output by the test device 600. It is assumed here that the chip selection signal CS-0 and address ADR are Low-active signals. It follows that where the chip identifier is to be set, the chip selection signal CS-0 and address ADR remain High when output. However, when inspection and measurement are actually performed as the tests following the setting of the chip identifier, the chip selection signal CS-0 is output continuously and the address ADR is also output as needed.

Prior to time t1 in FIG. 4, the test device 600 outputs a "Low" external control signal TRGI-0 representing a disenabled state. In this condition, the control signal output circuit 224 of the control signal output portion 210 in the 0th chip 200-0 outputs a "Low" downstream chip control signal TRGO-0 corresponding to the disenabled state. Also in this state, the chip identifier hold control signal REGEN input to the enable terminal of the chip identifier register 252 in the chip identifier holding portion 250 is Low reflecting the disenabled state. Thus the register value REG of the chip identifier register 252 is in the initial state where an effective chip identifier value is not held. Also in this state, with the output of the control signal output circuit 224 being "Low," the selector 253 of the chip identifier holding portion 250 is set to select the side of the fixed chip identifier holding portion 270. It should be noted that because the chip selection signal CS-0 is inactive, the signal selection portion 260 does not output the effective chip selection signal CS-0.

In the above-described state, the external control signal TRGI-0 output by the 0th chip 200-0 is input as an external control signal TRGI-1 to the first chip 200-1 positioned immediately upward. For this reason, the first chip 200-1 is in the same state as the 0th chip 200-0. That is, the control signal output circuit 224 outputs a "Low" downstream chip control signal TRGO-1 corresponding to the disenabled state, and the register value REG of the chip identifier register 252 is in the initial state. Also, the downstream chip control signal TRGO-1 is input to the second chip 200-2 so that a downstream chip control signal TRGO-2 is input to the third chip 200-3 accordingly. Correspondingly, the register value REG of the chip identifier register 252 is in the initial state in both the second chip 200-2 and the third chip 200-3. With the first embodiment of this disclosure, as described above, it is possible to initialize one after the other the chips making up the integrated semiconductor device 100 when the test device 600 outputs the external control signal TRGI-0 being Low.

At time t1, the test device 600 inverts the external control signal TRGI-0 to High corresponding to the enabled state in order to set the chip identifier, and outputs the inverted external control signal TRGI-0. At the same time, the test device 600 outputs the address ADR denoting the chip identifier "0" (ID=0). Incidentally, time t1 is the point in time at which the clock CLK falls. The output of the address ADR denoting the chip identifier "0" is continued from time t1 until time t3 at which the clock CLK again falls following one full clock cycle from time t1.

The control signal input circuit 221 of the control signal output portion 210 in the 0th chip 200-0 latches the external control signal TRGI-0 inverted to High at time t1, on the rising edge of the clock CLK at time t2. The input of the external control signal TRGI-0 serves to instruct the 0th chip 200-0 to hold its chip identifier. At time t2, the control signal output circuit 224 maintains the "Low" output. Thus the output of the exclusive-NOR gate 222, i.e., the chip identifier hold control signal REGEN input to the enable terminal of the chip identifier register 252, is inverted from Low to High.

Meanwhile, in the chip identifier holding portion 250, the address input circuit 251 latches the chip identifier value "0" that was output at time t1, at time t2 at which the clock CLK rises, and outputs the latched chip identifier value to the chip identifier register 252. The chip identifier register 252 holds, as the register value REG-0, the chip identifier value "0" being input when the input signal at the enable terminal is inverted from Low to High at the same time t2. The operation of holding the chip identifier value as the register value REG-0 is continued until the external control signal TRGI-0 is subsequently inverted to Low (disenabled), as will be discussed later.

At time t3 at which the clock CLK falls, the control signal output circuit 224 of the control signal output portion 210 (external control signal support output portion 220) latches the output of the control signal input circuit 221 that was inverted to High at time t2. This causes the downstream chip control signal TRGO-0 to be inverted from Low to High at time t3, and the inverted downstream chip control signal is input as the external control signal TRGI-1 to the first chip 200-1 positioned immediately upward.

The downstream chip control signal TRGO-0 is also input to the inverter 223. This causes the output of the exclusive-NOR gate 222 that was inverted from Low to High at time t2 to be again inverted to Low at time t3. Thereafter, the output of the exclusive-NOR gate 222 remains Low. That is, the chip identifier hold control signal REGEN is inverted from High to Low at time t3 and remains Low thereafter. This causes the chip identifier register 252 to hold continuously the register value REG-0 that was being held immediately before time t3, until the input signal to the enable terminal is subsequently inverted to High.

Since the downstream chip control signal TRGO-0 serves as the selection control signal for the selector 253, the selector 253 is set from time t3 on to select the register value REG-0 and to output the selected register value as the set chip identifier HLDID. In this manner, between time t2 and time t3, the value of the chip identifier input as the address ADR is held as the register value REG-0, and the value thus held is output as the set chip identifier HLDID. This is how the chip identifier is set on the 0th chip 200-0.

At time t3, the external control signal TRGI-1 inverted to High is input to the first chip 200-1 as discussed above. Also at time t3, the test device 600 changes the signal of the address ADR denoting the chip identifier to "1" and outputs the changed signal until time t5 following one full clock cycle of the clock CLK. As described, the workings of the first chip 200-1 positioned immediately upward become the same as those of the 0th chip 200-0 between time t1 and time t3. That is, the value "1" is held at the register value REG at time t4, i.e., the chip identifier "1" is set. At time t5, the downstream chip control signal TRGO-1 is output.

The above-mentioned downstream chip control signal TRGO-1 is input to the second chip 200-2 as an external control signal TRGI-2. Between time t5 and time t7, the test device 600 changes the value of the chip identifier denoted by the address ADR to, say, "2" and outputs the changed chip identifier. In this manner, the second chip 200-2 holds the chip identifier "2" at time t6. At time t7, the downstream chip control signal TRGO-2 is output.

The downstream chip control signal TRGO-2 is also input to the third chip 200-3 as an external control signal TRGI-3. Between time t7 and time t9, the chip identifier "3" is held. At time t9, a downstream chip control signal TRGO-3 is output. It should be noted that the third chip 200-3 is positioned highest in the stack so that the downstream chip control signal TRGO-3 will not be input to any other chip.

With the first embodiment of the present disclosure, as described above, the test device 600 first inputs the enabled-state external control signal TRGI-0 to the 0th chip 200-0 positioned lowest in the stack (at the first stage). The first-stage chip through the last-stage chip may then be set one after the other into the enabled state where the chip identifier can be successively input by taking advantage of one full clock cycle time difference of the clock CLK for example. In this case, the test device 600 outputs the address ADR denoting a suitable chip identifier value at intervals of the time period corresponding to one full clock cycle of the clock CLK. This makes it possible to set a suitable chip identifier to each of the chips 200 constituting the integrated semiconductor device 100.

Specifically, in the example of FIG. 4, the test device 600 successively outputs chip identifiers "0," "1," "2" and "3," in that order, during the period between time t1 and time t3, the period between time t3 and time t5, the period between time t5 and time t7, and the period between time t7 and time t9, respectively. As a result, the chip identifiers "0," "1," "2" and "3" are set to the first chip 200-0 through the third chip 200-3, respectively. The value of the chip identifier output as the address ADR in each of the above-mentioned periods may be set as desired on the side of the test device 600. Thus if the address ADR is output during each of the above periods as the chip identifiers "3," "0," "1" and "2," in that order, then the 0th chip 200-0 through the third chip 200-3 are assigned the chip identifiers "3," "0," "1" and "2," respectively. Likewise, if the address ADR is output during each of the above periods as the chip identifiers "2," "3," "0" and "1," in that order, then the 0th chip 200-0 through the third chip 200-3 are assigned the chip identifiers "2," "3," "0" and "1," respectively. In this manner, it will be appreciated that each chip may be assigned a suitable chip identifier by use of a suitable value of the chip identifier output by the test device 600 as the address ADR during each of the above-mentioned periods.

At actual test time, suppose for example that the chip identifiers "0," "1," "2" and "3" are set to the 0th chip 200-0 through the third chip 200-3, respectively, as shown in FIG. 4. Thereafter, the test device 600 outputs the chip selection signal CS-0 from the terminal 602. The chip selection signal CS-0 is input parallelly to the signal selection portions 260 (selectors 260a) of the 0th chip 200-0 through the third chip 200-3, typically via the chip selection signal input terminal 301A-0 of the 0th chip 200-0. At this point, only the 0th chip 200-0 holding the chip identifier "0" can enable the operation of the internal circuits 290 by selecting the input chip selection signal CS-0. That is, the 0th chip 200-0 is targeted for testing in this case.

While outputting the clock CLK for example, the test device 600 may output the command CMD, address ADR, etc., in a suitably timed manner to operate the internal circuits 290 of the 0th chip 200-0 for inspection and measurement. While the testing is underway, the external control signal TRGI-0 from time t1 on remains High corresponding to the enabled state. This perpetuates the state in which the configured chips 200 are being assigned their respective chip identifiers.

After the tests of the 0th chip 200-0 are completed, the test device 600 performs control to reset the chip identifiers that were set to the 0th chip 200-0 through the third chip 200-3 so as to bring about the initial state, as will be discussed later in reference to FIG. 5.

Through the control discussed above in reference to FIG. 4, the test device 600 then sets the chip identifier "0" to any one of the first chip 200-1 through the third chip 200-3 yet to be tested. At the same time, the test device 600 sets the chip identifier "1," "2" or "3" other than "0" to the remaining three chips 200. Then in the same manner as discussed above, the test device 600 outputs the chip selection signal CS-0 from the terminal 602 to test the chip 200 to which the chip identifier "0" is being set. In this manner, the test device 600 sets the chip identifier "0" successively to each of the chips 200 making up the integrated semiconductor device 100 in order to test each of the chips individually.

As a specific example, this embodiment may set the chip identifier to each of the 0th chip 200-0 through the third chip 200-3 in the following steps: First, the chip identifiers "0," "1," "2" and "3" are set to the 0th chip 200-0 through the third chip 200-3, respectively, to test the 0th chip 200-0 as described above. Next, the chip identifiers "3," "0," "1" and "2" are set to the 0th chip 200-0 through the third chip 200-3, respectively, to test the first chip 200-1. Then the chip identifiers "2," "3," "0" and "1" are set to the 0th chip 200-0 through the third chip 200-3, respectively, to test the second chip 200-2. Finally, the chip identifiers "1," "2," "3" and "0" are set to the 0th chip 200-0 through the third chip 200-3, respectively, to test the third chip 200-3.

However, as will be understood from the foregoing explanation, the chip identifier "0" need only be set to the chip 200 that is targeted for testing with this embodiment of the present disclosure. The other chips 200 not targeted to be tested may each be assigned any chip identifier value other than "0." In addition, the chip identifiers set to the other chips not targeted for testing may overlap with one another with no problem. Therefore, the chip identifier "0" may be set only to the chip 200 targeted for testing and the chip identifier "1" may be set to all other chips 200 for example. In any case, this embodiment of the disclosure allows a desired chip identifier to be set to each of the chips 200 configured.

[Example of the Chip Identifier Reset Operation]

Figure 5:
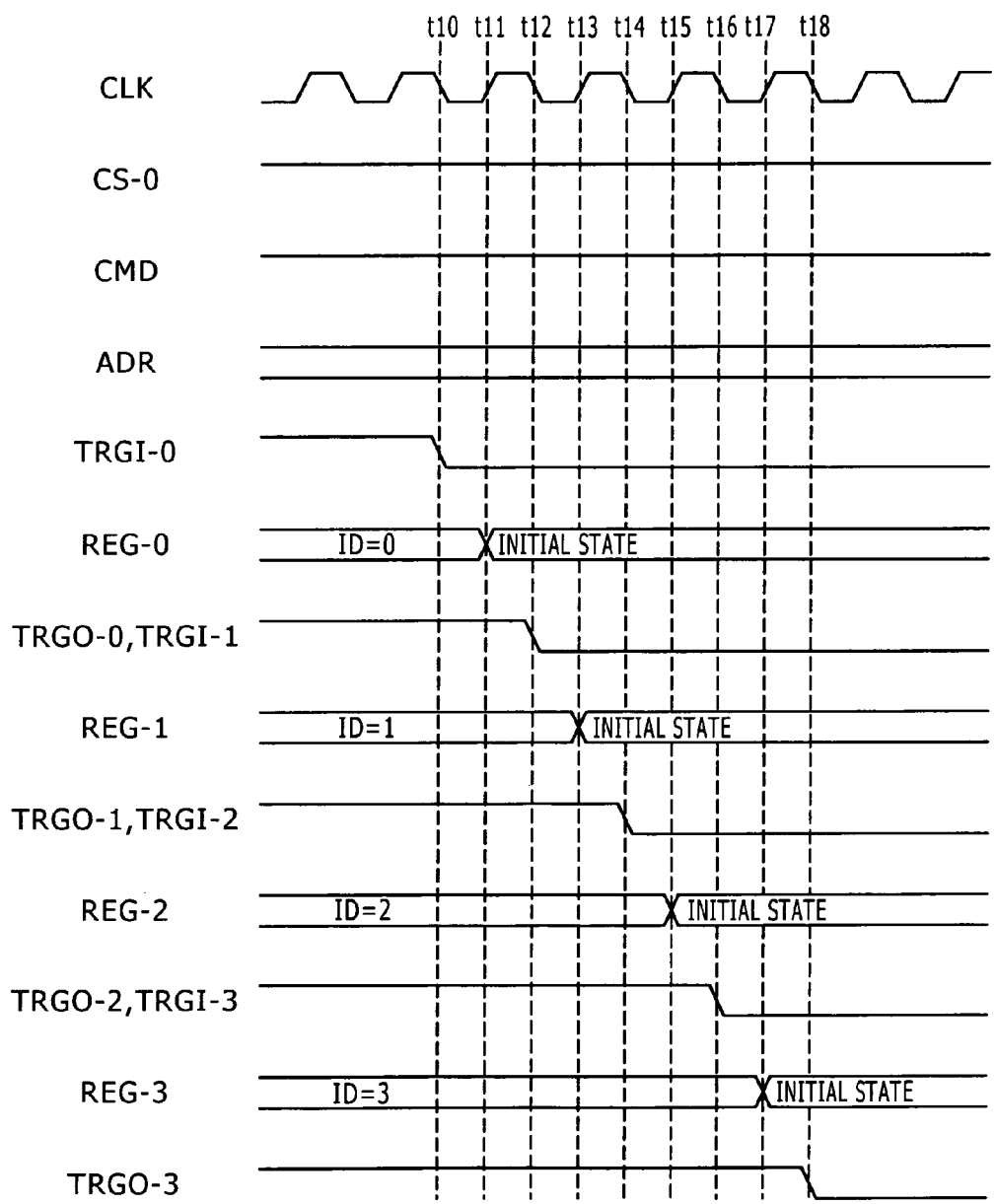
FIG. 5 is a timing chart showing typical operation timings corresponding to the chip identifiers being reset of the 0th chip through the third chip in the first embodiment.

The timing chart in FIG. 5 shows an example of the operation performed by the integrated semiconductor device 100 of which the structure is shown in FIG. 2, when the chip identifiers set on the configured chips 200 typically by the operation indicated in FIG. 4 are to be reset (i.e. initialized). This operation may be carried out typically in order to reset the chip identifiers held by the chips 200 when the chip identifier "0" is to be set on a chip 200 yet to be tested.

As the precondition for performing the operation to reset the chip identifiers, the test device 600 does not output the chip selection signal CS-0 and command CMD. This precondition is the same as that for setting the chip identifiers shown in FIG. 4. In addition, the address ADR is not output when the chip identifiers are to be reset. That is, no signal is output to designate the chip identifier to be set.

In FIG. 5, the period prior to time t10 represents the state where the 0th chip 200-0 through the third chip 200-3 hold their respective chip identifiers "0," "1," "2" and "3" subsequent to time t9 in FIG. 4, for example. In order to reset the chip identifiers being held, the test device 600 inverts the external control signal TRGI-0 from High (enable) to Low and maintains this status thereafter. In FIG. 5, the external control signal TRGI-0 is shown inverted from High to Low at time t10 at which the clock CLK falls.

When the external control signal TRGI-0 inverted to Low is input to the 0th chip 200-0 at time t10, the control signal input circuit 221 of the control signal output portion 210 (external control signal support output portion 220) in FIG. 2 operates as follows: At time t11 at which the clock CLK rises a half clock cycle after time t10, the control signal input circuit 221 latches the above-mentioned external control signal TRGI-0 being Low and outputs the latched signal. This inverts the output of the control signal input circuit 221 from High to Low at time t11. In turn, at time t12 at which the clock CLK falls a half clock cycle after time t11, the control signal output circuit 224 latches the "Low" output of the control signal input circuit 221 and outputs the latched signal. As a result, at time t12 following one full clock cycle from time t11 at which the external control signal TRGI-0 was inverted to Low, the downstream chip control signal TRGO-0 (external control signal TRGI-1) is inverted from High to Low.

In keeping with the operation above, the inputs to the exclusive-NOR gate 222 go Low each during the period between time t11 and time t12, so that the chip identifier hold control signal REGEN is brought High. This puts the chip identifier register 252 of the chip identifier holding portion 250 in the enabled state. As mentioned above, no effective address ADR is input at reset time. Thus between time t11 and time t12, no effective chip identifier value is input to the chip identifier register 252. This means that from time t11 on, the register value REG remains the value corresponding to the initial state. At time t12, the downstream chip control signal TRGO-0 is brought Low as described above. In turn, the selector 253 of the chip identifier holding portion 250 is set to select the fixed chip identifier from the fixed chip identifier holding portion 270 so that the selected identifier may be output as the set chip identifier HLDID. In this manner, between time t11 and time t12, the register value REG-0 in the chip identifier holding portion 250 is set to the initial state, and the register value REG-0 of the initial state is not output as the set chip identifier HLDID. That is, a state is brought about in which the chip identifier set earlier by the chip identifier set operation is reset.

Next, the downstream chip control signal TRGO-0 inverted to Low at time t12 is output by the 0th chip 200-0 and input to the first chip 200-1 as the external control signal TRGI-1. This causes the first chip 200-1 to perform the same operation discussed above, thereby initializing at time t13 the register value REG that is the output of the chip identifier register 252 and outputting at time t14 the downstream chip control signal TRGO-1 inverted to Low. Upon input of the downstream chip control signal TRGO-1 as the external control signal TRGI-2, the second chip 200-2 initializes at time t15 the register value REG that is the output of the chip identifier register 252. At time t16, the second chip 200-2 outputs the downstream chip control signal TRGO-2 inverted to Low. Also, upon input of the downstream chip control signal TRGO-2 as the external control signal TRGI-3, the third chip 200-3 initializes at time t17 the register value REG that is the output of the chip identifier register 252. At time t18, the third chip 200-3 outputs the downstream chip control signal TRGO-3 inverted to Low.

At reset time, as discussed above, the external control signal TRGI-0 output by the test device 600 is inverted from High to Low. This allows the chips 200 making up the integrated semiconductor device 100 to reset their chip identifiers one after the other at intervals of one full clock cycle of the clock CLK starting at the lowest chip (the least downstream chip) and ending at the highest chip (the most downstream chip).

The exclusive-NOR gate 222 furnished in the external control signal support output portion 220 shown in FIG. 2 may be replaced by an AND gate for example. In this case, upon resetting of the chip identifier, the enable signal is not input from the exclusive-NOR gate 222, so that the chip identifier register 252 continuously holds the register value REG in effect since before time t10. That is, the chip identifier is not initialized in the chip identifier register 252 itself.

However, in the case of the 0th chip 200-0 for example, the downstream chip control signal TRGO goes Low at time t12, so that the selector 253 is set also to select the fixed identifier of the fixed chip identifier holding portion 270. Where the fixed identifier is thus selected by the selector 253 at time t12, the register value REG is not output as the set chip identifier HLDID, so that the initial state is actually in effect. Therefore there is little problem with the operation even though the chip identifier register 252 continuously holds the register value REG since before time t10. This operation also holds for the second embodiment of this disclosure, to be explained below.

According to the first embodiment of this disclosure, as described above, the test device 600 first outputs the external control signal TRGI-0 to the 0th chip 200-0 at the first stage. In turn, the 0th chip 200-0 (first stage) through the Nth chip 200-N (last stage) are assigned, one after the other in that order, a time period in which the chip identifier can be set, at intervals of one full clock cycle of the clock CLK. In keeping with each time period in which the chip identifier can be set, the test device 600 outputs the signal of the address ADR denoting the chip identifier to be set. As a result, the chip identifier is set at intervals of one full clock cycle of the clock CLK to each of the 0th chip 200-0 (first stage) to the Nth chip 200-N (last stage), in that order. In this manner, even where the test device 600 is in a state of outputting only one chip selection signal, the identifier to be set on each chip may be changed as desired so that all chips constituting the integrated semiconductor device 100 can be tested. Correspondingly, the number of the terminals to be assigned by the test device 600 to one integrated semiconductor device 100 is reduced. This makes it possible, for example, to test simultaneously more integrated semiconductor devices 100 than before, thereby contributing to more efficient volume production of the integrated semiconductor devices 100.

2. Second Embodiment

Typical Structure of the Integrated Semiconductor Device

Figure 6:
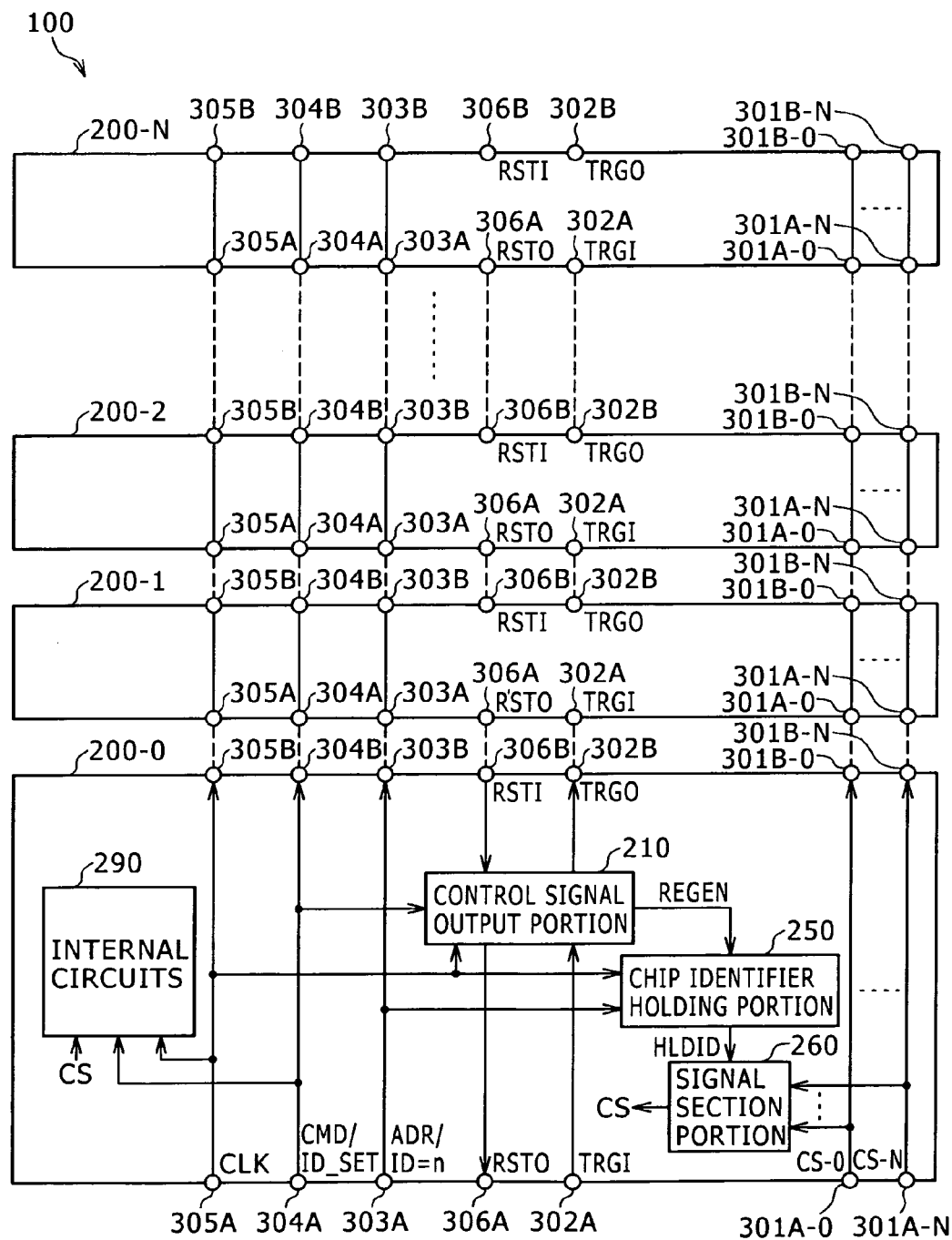
FIG. 6 is a schematic view showing a typical structure of an integrated semiconductor device as a second embodiment of the present disclosure.

FIG. 6 shows a typical structure of an integrated semiconductor device 100 as the second embodiment of the present disclosure. Of the reference numerals in FIG. 6, those already used in FIG. 1 designate like or corresponding parts, and their descriptions will be omitted hereunder. For example, each of the chips 200 shown in FIG. 6 has the same terminals as those indicated in FIG. 1. In addition to these terminals, each chip 200 is provided with a reset signal output terminal 306A paired with a reset signal input terminal 306B. An input reset signal RSTI input through the reset signal input terminal 306B is input to the control signal output portion 210. The control signal output portion 210 outputs an output reset signal RSTO to the reset signal output terminal 306A.

Also, the control signal output portion 210 of the second embodiment inputs the command CMD fed from the address input terminal 304A.

[Typical Structure of the Integrated Semiconductor Device of the Multilayer Type]

Figure 7:
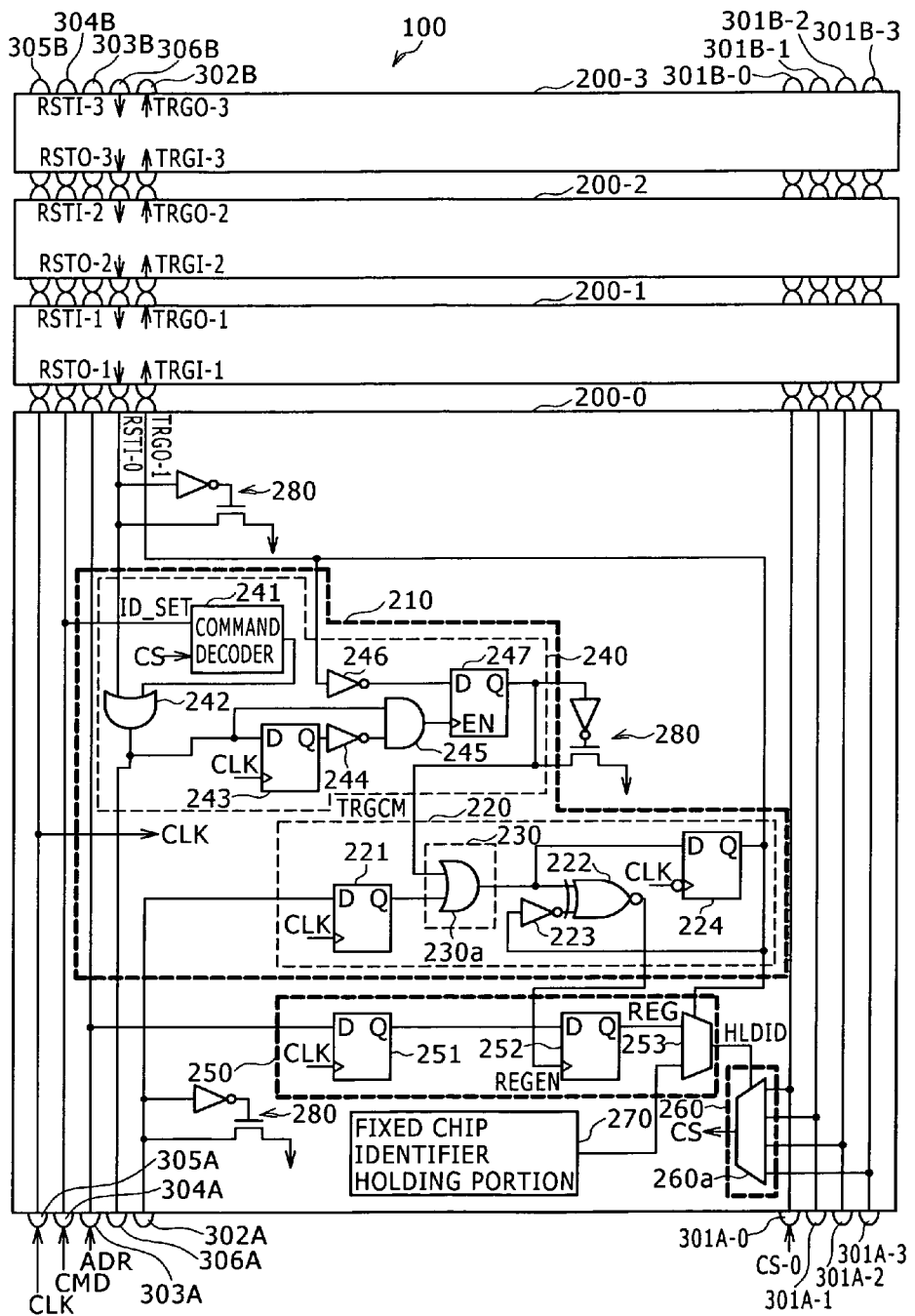
FIG. 7 is a schematic view showing a typical structure of the integrated semiconductor device of the multilayer type as the second embodiment.

FIG. 7 shows a typical structure of the integrated semiconductor device 100 as the multilayer type of the second embodiment indicated in FIG. 6. In the case of the multilayer type, the above-mentioned reset signal output terminal 306A and reset signal input terminal 306B may be formed typically as micro-bumps and positioned on the bottom side and top side, respectively, of the chip 200. The reset signal output terminal 306A and reset signal input terminal 306B are located in the same position in the plane direction of the chip 200. With this arrangement, as with the other terminals, the reset signal input terminal 306B on the top side of the lower chip is connected by contact with the reset signal output terminal 306A on the bottom side of the upper chip 200.

As shown for the 0th chip 200-0 in FIG. 7, the control signal output portion 210 of the second embodiment is furnished with a command support output portion 240 in addition to the external control signal support output portion 220 included in FIG. 1. Also, a selector 230 is added to the external control signal support output portion 220.

The command support output portion 240 generates a signal TRGCM from which to originate the downstream chip control signal TRGO in response to the input of a command (chip identifier set command) ID_SET (one of the commands CMD) for designating the chip identifier to be set. The command support output portion 240 includes a command decoder 241, an OR gate 242, a command pulse latch circuit 243, an inverter 244, an AND gate 245, an inverter 246, and a control signal register 247.

The command decoder 241 outputs a pulse signal (command pulse) in response to the input of the above-mentioned chip identifier set command ID_SET. In practice, the command decoder 241 is included in the internal circuits 290, not shown. Originally, the command decoder 241 is provided to interpret various commands CMD and thereby to control the parts constituting the internal circuits 290. For this reason, the command decoder 241 is designed to operate only when the chip selection signal CS is being input.

The OR gate 242 outputs the OR of the input reset signal RSTI input from the reset signal input terminal 306B and of the command pulse output by the command decoder 241. The output terminal of the OR gate 242 is connected to the input terminal of the command pulse latch circuit 243 and to one input terminal of the AND gate 245. The output terminal of the OR gate 242 is also connected to the reset signal output terminal 306A.

The command pulse latch circuit 243 latches the input command pulse on the rising edge of the clock CLK. The AND gate 245 outputs the AND of the output from the command pulse latch circuit 243 and of the output from the command pulse latch circuit 243 inverted by the inverter 244.

Depending on the status of an enable signal, the control signal register 247 latches and holds the downstream chip control signal TRGO inverted by the inverter 246. The enable signal to the control signal register 247 is the output from the AND gate 245. The output of the control signal register 247 serves as the command support control signal TRGCM.

When a "High" command support control signal TRGCM corresponding to the enabled state is obtained from the control signal register 247, the selector 230 selects and outputs the signal TRGCM from the control signal register 247. If the latch output from the control signal input circuit 221 is High corresponding to the enabled state, then the selector 230 selectively outputs the latch output from the control signal input circuit 221. The command support control signal TRGCM from the control signal register 247 and the latch output from the control signal input circuit 221 are not output simultaneously. However, even if the two signals are output simultaneously, there is little problem with the operation. For this reason, the selector 230 may be composed of a single OR gate 230a as shown illustratively. It should be noted that the output of the selector 230 is fed to one input terminal of the exclusive-NOR gate 222 and to the input terminal of the control signal output circuit 224.

As will be understood from the ensuing explanation, the command support output portion 240 operates effectively only in the 0th chip 200-0 at the first stage upon chip identifier setting at test time. From the second stage onward, each of the first chip 200-1 through the third chip 200-3 has its chip identifier set by operation of the external control signal support output portion 220 as in the case of the first embodiment. However, since all chips 200 are manufactured through the same processes, the first chip 200-1 through the third chip 200-3 of the second embodiment possess a circuit structure that includes the command support output portion 240 as with the 0th chip 200-0 shown in FIG. 7.

[Typical Test Environment for the Integrated Semiconductor Device]

Figure 8:
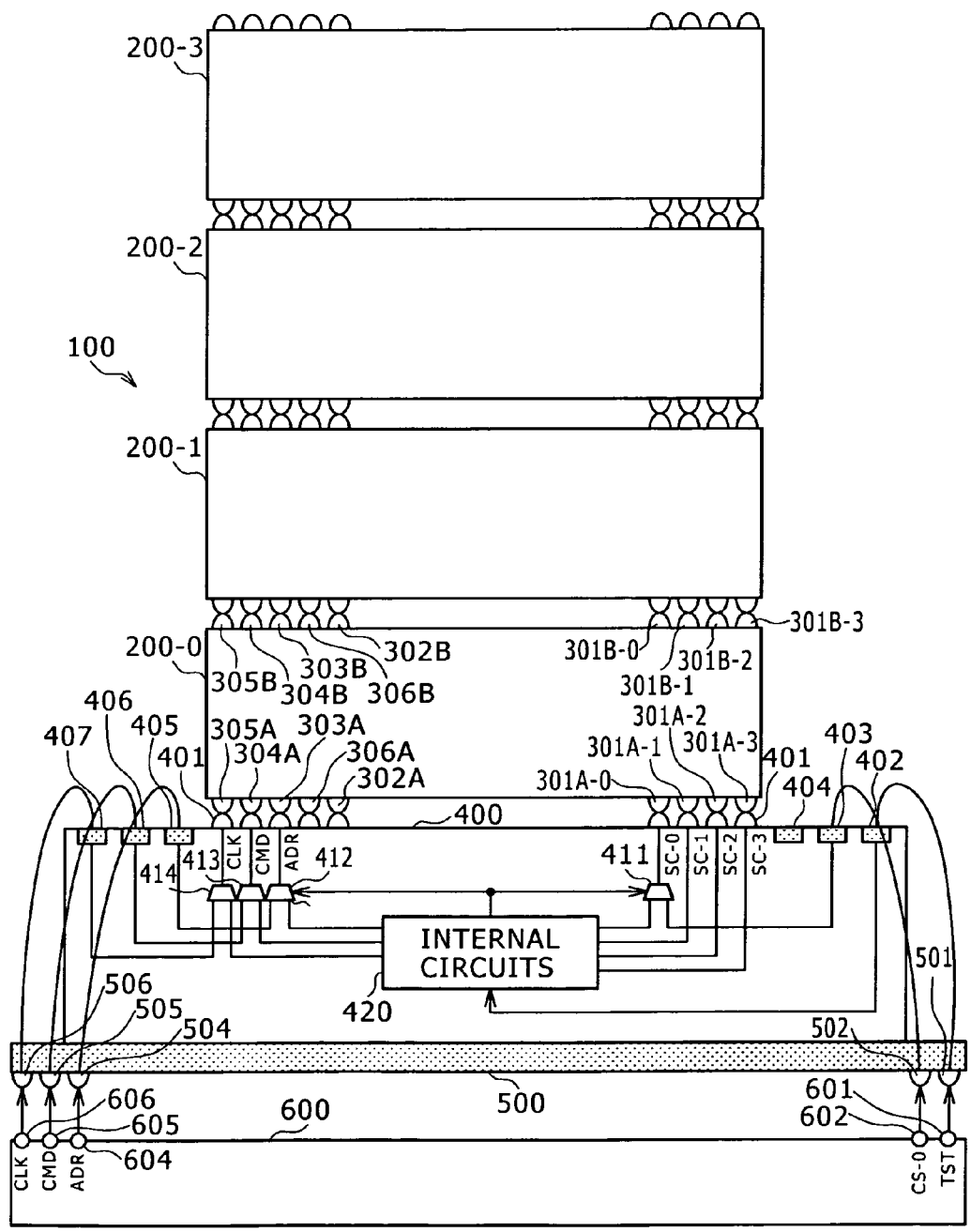
FIG. 8 is a schematic view showing a typical test environment for the integrated semiconductor device as the second embodiment.

FIG. 8 shows a typical test environment for the integrated semiconductor device 100 as the second embodiment of the present disclosure. Of the reference numerals in FIG. 8, those already used in FIG. 3 corresponding to the first embodiment designate like or corresponding parts, and their descriptions will be omitted hereunder.

In the test environment of FIG. 8, there is no terminal 603 that is furnished on the test device 600 in FIG. 3, the terminal being used to output the external control signal TRGI-0. That is, with the second embodiment, the test device 600 does not output the external control signal TRGI-0 as a trigger to set the chip identifier to the chip 200. The test device 600 of the second embodiment thus has one less terminal to be assigned to one integrated semiconductor device 100 than the first embodiment. Correspondingly, no signal line is connected to the pad 404 of the logic 400. Also, the terminal 401 corresponding to the control signal input terminal 302A of the 0th chip 200-0 on the top side of the logic 400 is not connected and therefore left open.

The reset signal RSTI (RSTO) is used solely on the side of the chips 200 making up the integrated semiconductor device 100 and need not be input to the logic 400. For this reason, the terminal 401 corresponding to the reset signal output terminal 306A of the logic 400 is not connected to any signal line and thus left open. In practice, however, some signal line may be connected to the terminal 401.

[Example of the Chip Identifier Set Operation]

Figure 9:
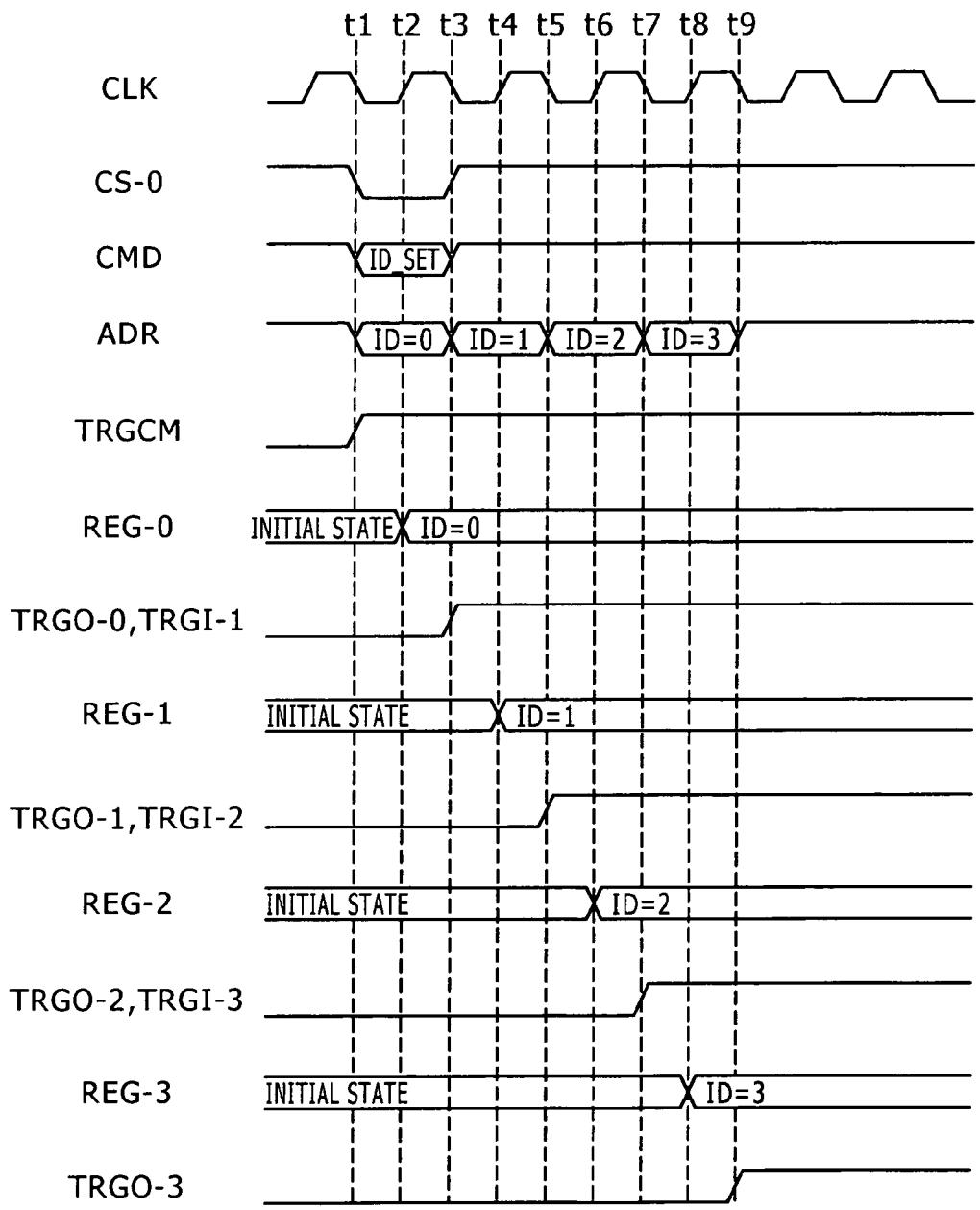
FIG. 9 is a timing chart showing typical operation timings corresponding to the chip identifiers being set of a 0th chip through a third chip in the second embodiment.

The timing chart in FIG. 9 shows an operation example corresponding to the setting of chip identifiers performed by the integrated semiconductor device 100 of which the structure is shown in FIG. 7, in the test environment indicated in FIG. 8. During the chip identifier setting operation performed by the first embodiment explained above in reference to FIG. 3, the chip selection signal CS-0 and command CMD are not output. By contrast, with the second embodiment operating as shown in FIG. 9, the chip selection signal CS-0 and command CMD (chip identifier set command ID_SET) are output using the timings to be explained below. The address ADR is output in order of the chip identifiers "0," "1," "2" and "3" using the same timings as those of the first embodiment shown in FIG. 4.

Prior to time t1 in FIG. 9, the chip identifier register 252 of each chip 200 is in the initial state not holding an effective chip identifier. In the initial state, the control signal output circuit 224 and control signal register 247 of the control signal output portion 210 give a "low" output corresponding to the disenabled state. At this point, the selector 253 of each chip 200 selects the fixed chip identifier held in the fixed chip identifier holding portion 270 and outputs the selected identifier as the selection control signal of the signal selection portion 260 (selector 260a). It is assumed here that fixed chip identifiers "0," "1," "2" and "3" are assigned to the 0th chip 200-0 through the third chip 200-3, respectively.

In order to set the chip identifier with the second embodiment, the test device 600 outputs the chip identifier set command ID_SET from the terminal 605 corresponding to the command CMD. The output timing here is one full clock cycle between time t1 at which the clock CLK falls and time t3 at which the clock CLK again falls, as shown in FIG. 9. During the same time period between time t1 and time t3, the test device 600 outputs the chip selection signal CS-0 from the terminal 602. Also between time t1 and time t3, the test device 600 outputs the address signal ADR denoting the chip identifier "0" from the terminal 604. The chip identifier set command ID_SET output by the test device 600 to set the chip identifier is an example of the hold command.

The chip selection signal CS-0 is input to the 0th chip 200-0 through the third chip 200-3 initially during the time period between time t1 and time t3. At this point, the chip selection signal CS-0 corresponds to the chip identifier "0." In this case, only in the 0th chip 200-0 at the first stage among the 0th chip 200-0 through the third chip 200-3 can the signal selection portion 260 select the chip selection signal CS-0 and feed the selected signal to the internal circuits 290. Thus during the time period between time t1 and time t3, the command decoder 241 may operate in response to the command CMD only in the 0th chip 200-0 among the 0th chip 200-0 through the third chip 200-3.

As described, the command decoder 241 of only the 0th chip 200-0 works to output a "High" command pulse between time t1 and time t3 in response to the chip identifier set command ID_SET being input during the same time period between t1 and time t3.

In the command support output portion 240 of the 0th chip 200-0, the above-mentioned "High" command pulse is input to the AND gate 245 via the OR gate 242. Since the output of the command pulse latch circuit 243 is still Low at time t1, the inverter 244 maintains the "High" output. Thus when the "High" command pulse is input at time t1, the output of the AND gate 245 is inverted from Low to High. At time t2 at which the clock CLK rises, the command pulse latch circuit 243 latches the "high" command pulse. In turn, the AND gate 245 gives a "Low" output at time t2. That is, the AND gate 245 goes High between time t1 and time t2.

A "High" enable signal is input to the control signal register 247 during the time period between time t1 and time t2. The external control signal TRGI-1 output by the control signal output circuit 224 maintains the "Low" state up to time t3, as will be discussed later. Accordingly, between time t1 and time t2, the control signal output circuit 224 latches the external control signal TRGI-1 fed to the input terminal and inverted to High. From time t2 on when the enable signal is brought Low, the control signal output circuit 224 continuously outputs the latched "High" signal. That is, as shown in FIG. 9, the "High" command support control signal TRGCM is output from time t1 onward.

The above-mentioned "High" command support control signal TRGCM is output through the OR gate 230a of the selector 230. In turn, the control signal output circuit 224 of the external control signal support output portion 220 latches the "High" command support control signal TRGCM at time t3 at which the clock CLK falls. This allows the "High" downstream chip control signal TRGO-0 to be output from time t3 on.

Also from time t1 on, when the "High" command support control signal TRGCM is input to the OR gate 230a, the input of the "High" command support control signal TRGCM puts the chip identifier hold control signal REGEN in the enabled state. In this state, the chip identifier register 252 inputs and holds the signal which is latched by the address input circuit 251 at time t2 and which denotes the chip identifier "0." Then from time t2 on, the chip identifier register 252 continuously outputs the register value REG typically denoting the chip identifier "0." At time t3, with the downstream chip control signal TRGO-0 inverted to High, the selector 253 in the chip identifier holding portion 250 outputs the register value REG of the chip identifier register 252 as the set chip identifier HLDID. Thus in the timeline up to time t3, the chip identifier "0" is set to the 0th chip 200-0.

Also, the "High" downstream chip control signal TRGO-0 output by the 0th chip 200-0 at time t3 is input as the external control signal TRGI-1 to the first chip 200-1 positioned immediately upward. In turn, the first chip 200-1 operates in the same manner as with the first embodiment. As a result, as shown in FIG. 9, the first chip 200-1 holds the register value REG indicative of the chip identifier "1" from time t4 on, a half clock cycle of the clock CLK after time t3. From time t5 on, one full clock cycle of the clock CLK after time t3, the first chip 200-1 outputs the downstream chip control signal TRGO-1 (TRGI-2). From time t6 onward, the second chip 200-2 holds the register value REG indicative of the chip identifier "2." From time t7 on, the second chip 200-2 outputs the downstream chip control signal TRGO-2 (TRGI-3). From time t8 onward, the third chip 200-3 holds the register value REG indicative of the chip identifier "3." From time t9 on, the third chip 200-3 outputs the downstream chip control signal TRGO-3.

[Example of the Chip Identifier Reset Operation]

Figure 10:
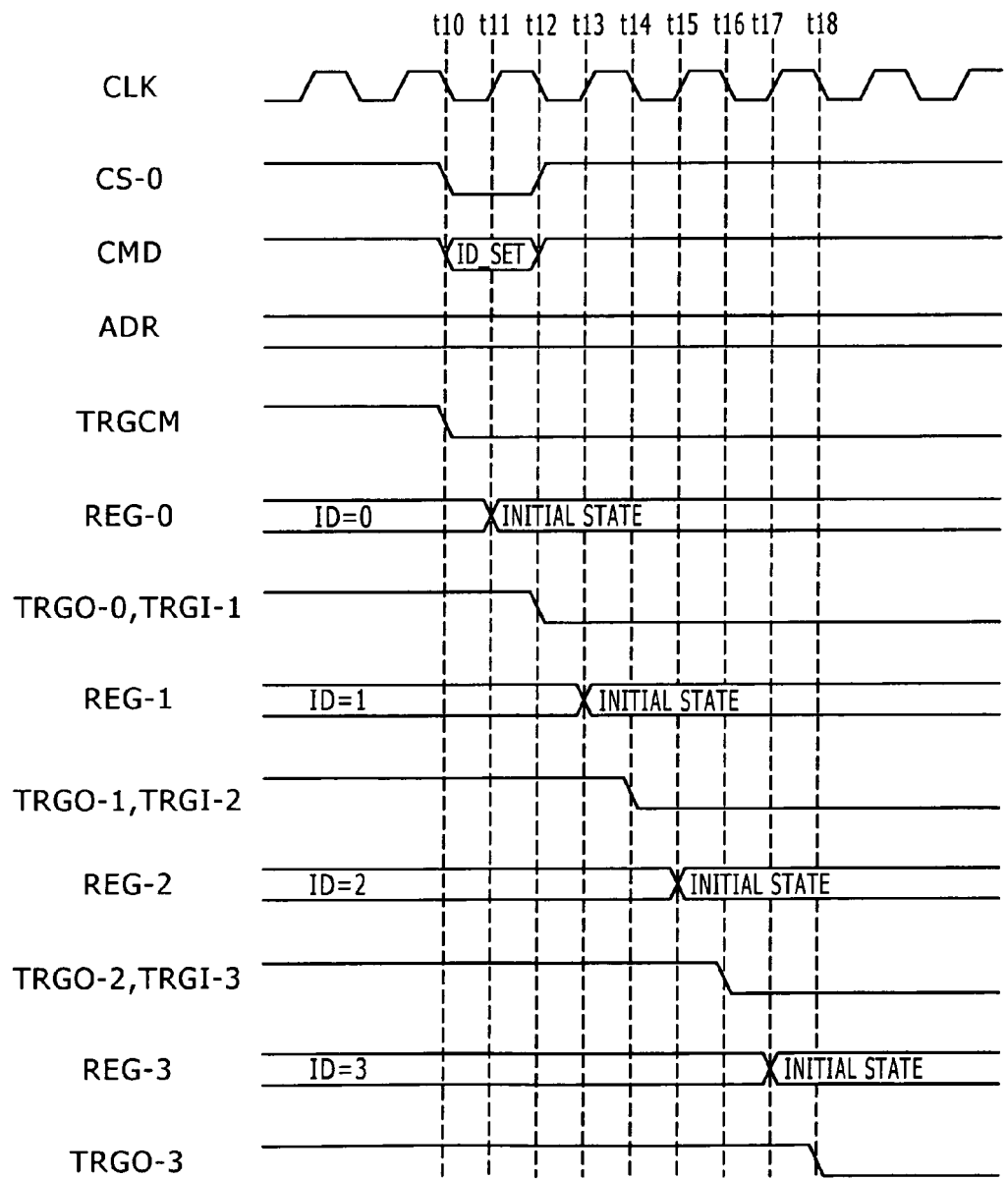
FIG. 10 is a timing chart showing typical operation timings corresponding to the chip identifiers being reset of the 0th chip through the third chip in the second embodiment.

The timing chart in FIG. 10 shows an example of the operation performed by the integrated semiconductor device 100 of which the structure is shown in FIG. 7, when chip identifiers are to be reset (i.e. initialized). Prior to time t10 in FIG. 10 is the state in which each of the 0th chip 200-0 through the third chip 200-3 has its chip identifier being set thereto.

In order to reset the chip identifier with the second embodiment, the test device 600 outputs the chip selection signal CS-0 and chip identifier set command ID_SET between time t10 and time t12 as shown in FIG. 10. Where any chip identifier is already set, the chip identifier set command ID_SET serves to designate the chip identifier to be reset. The chip identifier set command ID_SET output by the test device 600 to reset the chip identifier is an example of the initialization command, described in the appended claims.

At this point, one of the 0th chip 200-0 through the third chip 200-3 has the chip identifier "0" set thereto. It is assumed here for example that the chip identifier "0" is set to the third chip 200-3 at the highest stage. In this case, only the command decoder 241 of the third chip 200-3 outputs the command pulse in response to the chip identifier set command ID_SET. The command pulse is fed to the reset signal output terminal 306A as an output reset signal RSTO-3 via the OR gate 242. The reset signal output terminal 306A of the third chip 200-3 is connected to the reset signal input terminal 306B of the second chip 200-2. This allows the output reset signal RSTO-3 to be input to the second chip 200-2 as an input reset signal RSTI-2. Also, the input reset signal RSTI-2 is output as an output reset signal RSTO-2 that is input to the first chip 200-1 as an input reset signal RSTI-1. Furthermore, the input reset signal RSTI-1 is output by the first chip 200-1 as an output reset signal RSTO-1 that is input to the 0th chip 200-0 as an input reset signal RSTI-0.

As described above, the reset signal is forwarded successively through the layered chips 200 from one to the other starting at the highest-positioned chip and ending at the lowest-positioned chip. Thus the "High" reset signal is input to the 0th chip 200-0 between time t10 and time t12.

At time t10, the control signal register 247 of the command support output portion 240 in the 0th chip 200-0 is in the state of outputting the command support control signal TRGCM being High. In this state, the input of a "High" reset signal to the command pulse latch circuit 243 causes the AND gate 245 to go High between time t10 and time t12. Because the downstream chip control signal TRGO-0 is High between time t10 and t12, the control signal register 247 latches Low.

During the above-described operation, both inputs to the exclusive-NOR gate 222 of the external control signal support output portion 220 are Low, so that between time t10 and time t12, the chip identifier hold control signal REGEN goes High corresponding to the enabled state. At time t11 at which the clock CLK rises (between time t10 and time 12), the chip identifier holding portion 250 inputs the address ADR latched by the address input circuit 251. However, since no effective address ADR is input at reset time, the register value REG of the chip identifier register 252 is initialized from time t11 on.

The "Low" command support control signal TRGCM output from time t10 on is latched by the control signal output circuit 224 of the external control signal support output portion 220 at time t12 at which the clock CLK falls. Thus from time t12 on, the downstream chip control signal TRGO-0 is Low when output. Correspondingly, from time t12 onward, the selector 253 is set to select the fixed chip identifier from the fixed chip identifier holding portion 270 and to output the selected identifier as the set chip identifier HLDID. In this manner, the operation up to time t12 brings about the state in which the chip identifier having been set to the 0th chip 200-0 so far is reset.

From time 12 on, with the "Low" downstream chip control signal TRGO-0 output as described above, the same operation as that discussed earlier in reference to FIG. 5 is carried out by the remaining first chip 200-1 through third chip 200-3. That is, when the external control signal TRGI input successively to each of the first chip 200-1 through the third chip 200-3 goes Low, the register value REG of the chip identifier register 252 in the applicable chip is initialized. Each chip 200 inverts the downstream chip control signal TRGO to Low before outputting the inverted signal TRGO to the chip 200 positioned immediately upward. In this manner, with the second embodiment, the input of the chip identifier set command ID_SET is used as a trigger to initialize successively each of the chip identifiers set on the 0th chip 200-0 through the third chip 200-3.

With the second embodiment of the present disclosure in use, the test device 600 is caused to output as a command CMD the chip identifier set command ID_SET designating the chip identifier to be set or reset (i.e., initialized) as described above. In response to the chip identifier set command ID_SET being input, each of the chips 200 constituting the integrated semiconductor device 100 has its chip identifier set or reset successively at intervals of one full clock cycle of the clock CLK, starting at the lowest-positioned chip and ending at the highest-positioned chip. Thus the second embodiment makes it possible for the test device 600 to reduce the number of its terminals for outputting the external control signal TRGI to the integrated semiconductor device 100.

In the above-described embodiments of the present disclosure, the logical circuit structures of the control signal output portion 210, chip identifier holding portion 250, etc., illustrated specifically in FIGS. 2 and 7 are only examples. Other suitable structures may be adopted instead as long as the workings similar to those discussed above are ensured thereby.

The setting of the chip identifier was shown carried out at test time in conjunction with the above-described embodiments. Alternatively, the chip identifier set operation may be likewise performed typically under control of the logic in normal operation as well.

The embodiments and their variations described above are merely examples in which the present disclosure may be implemented. As is clear from above, the particulars of the embodiments and their variations in the description of the preferred embodiments correspond basically to the disclosed matters. Likewise, the disclosed matters correspond basically to the particulars with the same names in the description of the preferred embodiments. However, these embodiments and their variations and other examples of the present disclosure are not limitative thereof, and it should be understood by those skilled in the art that various modifications, combinations, sub-combinations and alterations may occur depending on design requirements and other factor in so far as they are within the scope of the invention.

The present disclosure contains subject matter related to that disclosed in Japanese Priority Patent Application JP 2010-131346 filed in the Japan Patent Office on Jun. 8, 2010, the entire content of which is hereby incorporated by reference.

What is claimed is:

1. A semiconductor device comprising:
a control signal input circuit configured to output an external control signal, said external control signal output from said control signal input circuit being an outputted control signal;
a control signal output circuit configured to output said outputted control signal, said outputted control signal outputted from said control signal output circuit being a downstream chip control signal;
an address input circuit configured to output a semiconductor identifier, said semiconductor identifier output from said address input circuit being a chip identifier;
a chip identifier register configured to output a register value, said chip identifier output from said chip identifier register being said register value;
a multiplexer configured to use said downstream chip control signal to control a selection between a fixed identifier value and said register value,
wherein a hold control signal is used to latch said chip identifier into said chip identifier register, said hold control signal being a combination of said external control signal and said downstream chip control signal.

2. The semiconductor device according to claim 1, wherein a clock is used to latch said external control signal into said control signal input circuit.

3. The semiconductor device according to claim 2, wherein said clock is used to latch said semiconductor identifier into said address input circuit.

4. The semiconductor device according to claim 2, wherein said clock is inverted to become an inverted clock, said inverted clock being used to latch said outputted control signal into said control signal output circuit.

5. The semiconductor device according to claim 1, further comprising:
a fixed chip identifier holding portion configured to store a predetermined chip identifier, said predetermined chip identifier output from said fixed chip identifier holding portion being said fixed identifier value.

6. The semiconductor device according to claim 1, further comprising:
a signal selection portion configured to use a set chip identifier to control a selection between one of multiple signal lines, said fixed identifier value or said register value being output from said multiplexer as said set chip identifier.

7. The semiconductor device according to claim 1, further comprising:
an address input terminal configured to receive address signals, one of the address signals being said semiconductor identifier.

8. An integrated semiconductor device comprising:
a plurality of chips, each of the chips having a configuration of the semiconductor device according to claim 1.

9. The integrated semiconductor device according to claim 8, wherein the downstream chip control signal from one of the chips becomes the external control signal in another of the chips.

* * * * *